(12) United States Patent
Akiyama

(10) Patent No.: US 8,415,750 B2
(45) Date of Patent: Apr. 9, 2013

(54) SEMICONDUCTOR DEVICE AND METHOD OF FABRICATING THE SAME

(75) Inventor: Kazutaka Akiyama, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 388 days.

(21) Appl. No.: 12/685,415

(22) Filed: Jan. 11, 2010

(65) Prior Publication Data

US 2011/0024849 A1 Feb. 3, 2011

(30) Foreign Application Priority Data

Jul. 28, 2009 (JP) .................................. 2009-175310

(51) Int. Cl.
*H01L 23/48* (2006.01)

(52) U.S. Cl.
USPC .............................. 257/401; 257/368; 257/688

(58) Field of Classification Search .................. 257/368, 257/401, 288, 688, E29.255
See application file for complete search history.

(56) References Cited

U.S. PATENT DOCUMENTS

| | | | |
|---|---|---|---|
| 7,498,636 B2 | 3/2009 | Kishiro | |
| 7,808,064 B2 | 10/2010 | Kawasaki et al. | |
| 2006/0255465 A1 | 11/2006 | Kishiro | |
| 2007/0069364 A1 | 3/2007 | Kawano et al. | |
| 2008/0265392 A1* | 10/2008 | Kawano | 257/688 |
| 2009/0014891 A1* | 1/2009 | Chang et al. | 257/777 |
| 2009/0096051 A1 | 4/2009 | Sugiyama et al. | |
| 2009/0152602 A1 | 6/2009 | Akiyama | |
| 2009/0283847 A1 | 11/2009 | Kawasaki et al. | |

FOREIGN PATENT DOCUMENTS

| | | |
|---|---|---|
| JP | 2006-319204 | 11/2006 |
| JP | 2007-123857 | 5/2007 |
| JP | 2009-158862 | 7/2009 |

OTHER PUBLICATIONS

Notification of Reason for Rejection dated Jul. 6, 2012 from the Japanese Patent Office in corresponding Japanese Application No. 2009-175310, (3 total pages).

* cited by examiner

*Primary Examiner* — Tran Tran
(74) *Attorney, Agent, or Firm* — Finnegan, Henderson, Farabow, Garrett & Dunner, L.L.P.

(57) ABSTRACT

A semiconductor device according to one embodiment includes: a semiconductor substrate; an element isolation insulating film embedded in the vicinity of a front surface of the semiconductor substrate; a through plug penetrating the semiconductor substrate from a back surface to the front surface so as to penetrate through the element isolation insulating film, and having a multi-stage structure comprising an upper stage portion and a lower stage portion, the upper stage portion having a region surrounded by the element isolation insulating film in the semiconductor substrate, the lower stage portion having a diameter larger than that of the upper stage portion; and a contact plug connected to an end portion of the through plug on the frond surface side of the semiconductor substrate for connecting a conductive member formed above the front surface side of the semiconductor substrate to the through plug.

9 Claims, 24 Drawing Sheets

(Prior Art)

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2009-175310, filed on Jul. 28, 2009, the entire contents of which are incorporated herein by reference.

BACKGROUND

A conventional semiconductor device is known in which a through plug (a through plug) is provided to a Si substrate for highly densifying wirings.

There is a semiconductor device in which a through plug is connected to an upper wiring via a contact plug formed on a Si substrate. The semiconductor device, for example, is disclosed in JP-A 2007-123857. When a through plug is connected to an electrode pad formed on a Si substrate, there is a possibility that the electrode pad is removed due to overetching when a contact hole for the through plug is formed on the Si substrate, however, since the contact plug is thicker than the electrode pad, it is less likely to be removed even if etching reaches the contact plug.

However, when the etching reaches the contact plug, there is a possibility that etching damage is generated on a bottom surface of the contact plug and the contact plug is not appropriately connected to the through plug, which may result in an increase in electrical resistance at a connection. Furthermore, there is a risk that the contact plug does not electrically conduct to the through plug.

BRIEF SUMMARY

A semiconductor device according to one embodiment includes: a semiconductor substrate; an element isolation insulating film embedded in the vicinity of a front surface of the semiconductor substrate; a through plug penetrating the semiconductor substrate from a back surface to the front surface so as to penetrate through the element isolation insulating film, and having a multi-stage structure comprising an upper stage portion and a lower stage portion, the upper stage portion having a region surrounded by the element isolation insulating film in the semiconductor substrate, the lower stage portion having a diameter larger than that of the upper stage portion; and a contact plug connected to an end portion of the through plug on the frond surface side of the semiconductor substrate for connecting a conductive member formed above the front surface side of the semiconductor substrate to the through plug.

A method of fabricating a semiconductor device according to another embodiment includes: embedding an element isolation insulating film in the vicinity of a front surface of a semiconductor substrate; forming a contact plug on the element isolation insulating film so that a bottom surface thereof is in contact with an upper surface of the element isolation insulating film; forming a contact hole in the semiconductor substrate by etching a back surface of the semiconductor substrate using the element isolation insulating film as a stopper; forming an insulating film so as to cover an inner surface of the contact hole; deepening the contact hole by etching the insulating film and the element isolation insulating film on a bottom of the contact hole, thereby exposing at least a portion of the bottom surface of the contact plug; and forming a through plug in the contact hole so as to be connected to the bottom surface of the contact plug.

A method of fabricating a semiconductor device according to another embodiment includes: embedding an element isolation insulating film in the vicinity of a front surface of a semiconductor substrate; forming a dummy gate ring on the element isolation insulating film; forming an interlayer insulating film on the semiconductor substrate, the element isolation insulating film and the dummy gate ring; forming a conductive member on the interlayer insulating film; forming a contact hole in the semiconductor substrate by etching a back surface of the semiconductor substrate using the element isolation insulating film as a stopper; forming an insulating film so as to cover an inner surface of the contact hole; deepening the contact hole by etching the insulating film and the element isolation insulating film on a bottom of the contact hole, thereby exposing a region of the interlayer insulating film inside of the dummy gate ring without exposing a region thereof outside of the dummy gate ring; further deepening the contact hole by etching the exposed region of the interlayer insulating film using the dummy gate ring as a mask, thereby exposing at least a portion of the conductive member; and forming a through plug in the contact hole so as to be connected to the conductive member.

DETAILED DESCRIPTION

First Embodiment

Figure 1:
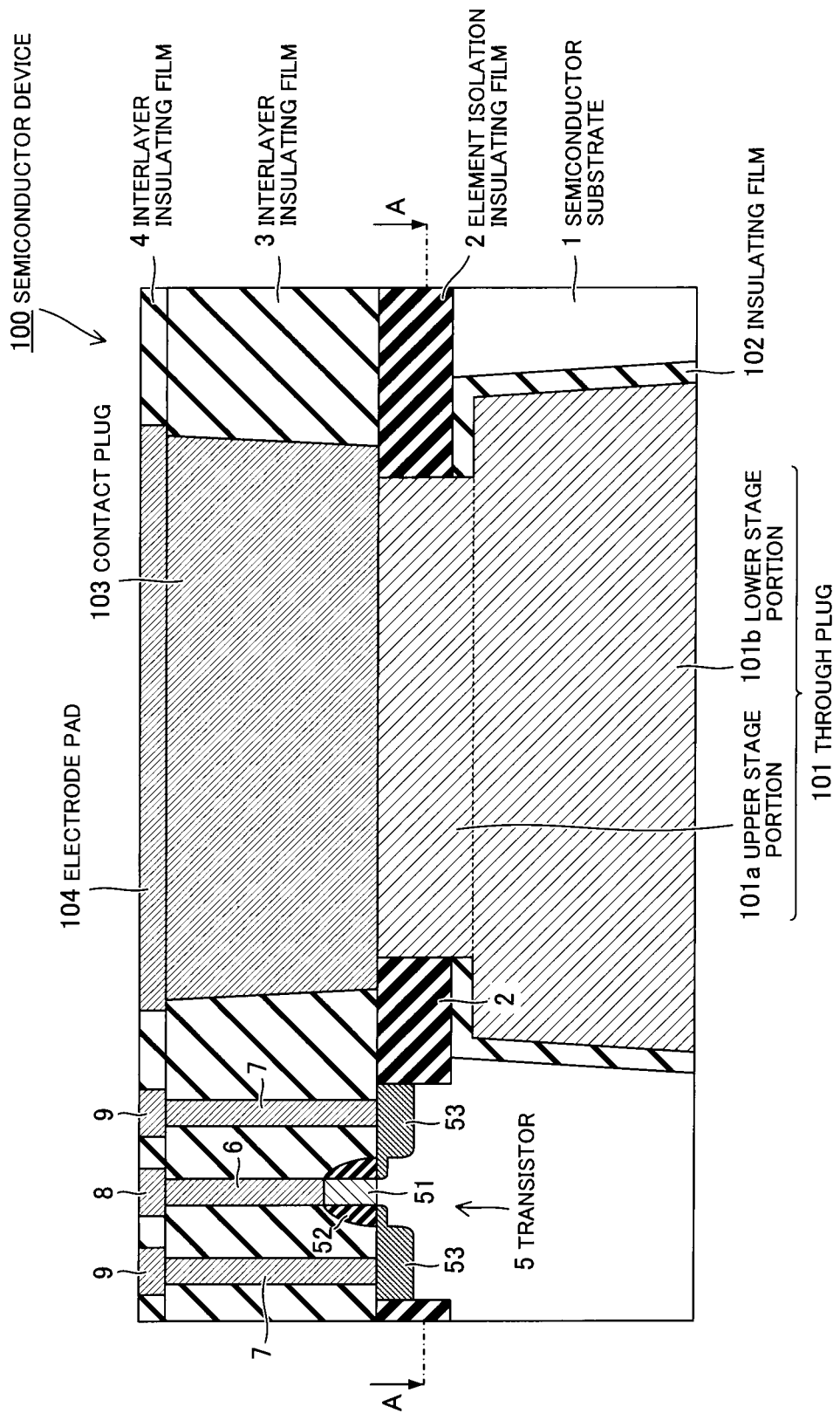
FIG. 1 is a cross sectional view of a semiconductor device according to a first embodiment.
Figure 2A:
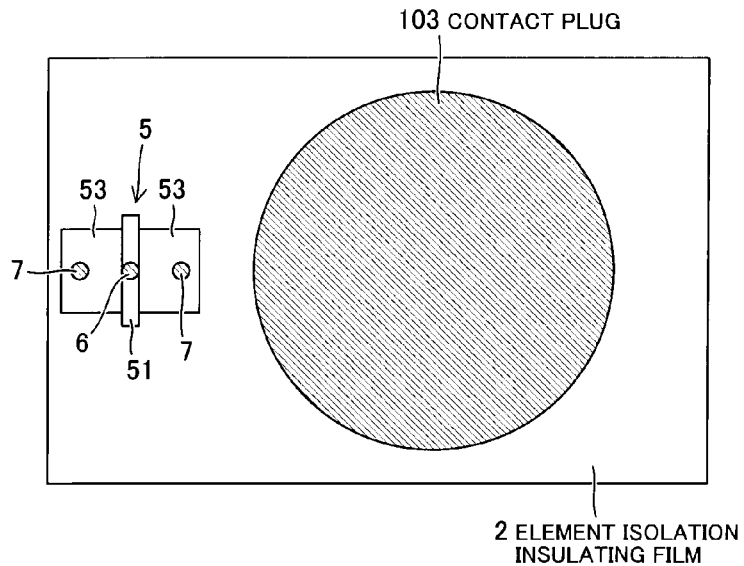
FIGS. 2A and 2B are views of the semiconductor device according to the first embodiment, which are respectively a plan view and a cross sectional view taken on line A-A of FIG. 1.
Figure 2B:
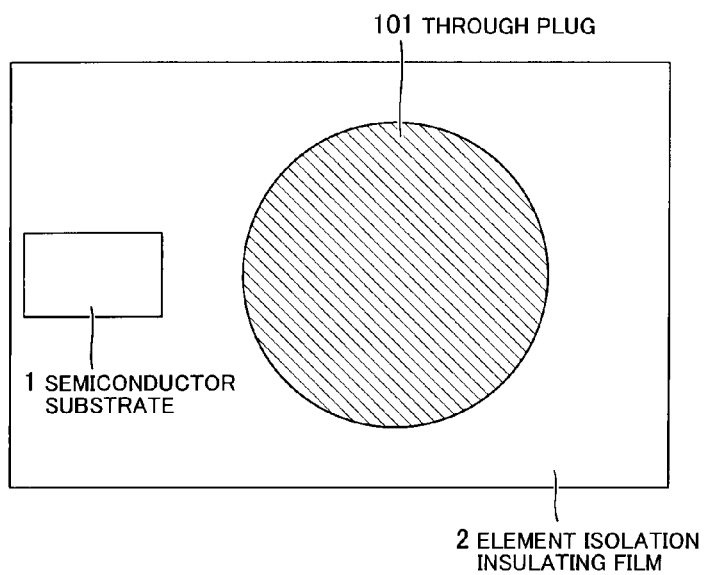

FIG. 1 is a cross sectional view of a semiconductor device 100 according to a first embodiment. In addition, FIG. 2A is a plan view of the semiconductor device 100 and FIG. 2B is a cross sectional view of the semiconductor device 100 taken on line A-A of FIG. 1. Note that, illustrations of below-described interlayer insulating films 3 and 4, wirings 8 and 9, an electrode pad 104 and a gate sidewall 52 are omitted in FIG. 2A.

A semiconductor device 100 has a transistor 5 formed on a semiconductor substrate 1 and electrically isolated from other elements by an element isolation insulating film 2, interlayer insulating films 3 and 4 formed on the semiconductor substrate 1, a through plug 101 penetrating the semiconductor substrate 1 from a back surface to a front surface, an electrode pad 104 formed in the interlayer insulating film 4, and a contact plug 103 formed in the interlayer insulating film 3 for connecting the through plug 101 to the electrode pad 104.

The semiconductor substrate 1 is made of Si-based polycrystal such as Si crystal.

The element isolation insulating film 2 is made of insulating material such as $SiO_2$ which is embedded in the vicinity of the front surface of the semiconductor substrate 1, and has, e.g., a STI (Shallow Trench Isolation) structure. Depth of a bottom surface of the element isolation insulating film 2 from the front surface of the semiconductor substrate 1 is, e.g., 0.2 μm.

The interlayer insulating film 3 has a laminated structure composed of, e.g., a 0.03 μm thick SiN film and a 0.5 μm thick $SiO_2$ film. The interlayer insulating film 4 is made of insulating material such as $SiO_2$.

The transistor 5 has a gate electrode 51 formed on the semiconductor substrate 1 via a gate insulating film (not shown), gate sidewalls 52 formed on side faces of the gate electrode 51, and source/drain regions 53 formed in a region of the semiconductor substrate 1 on both sides of the gate electrode 51.

The gate electrode 51 is connected to a wiring 8 in the interlayer insulating film 4 via a contact plug 6 in the interlayer insulating film 3. In addition, the source/drain region 53 is connected to a wiring 9 in the interlayer insulating film 4 via a contact plug 7 in the interlayer insulating film 3.

The gate electrode 51 is made of polycrystalline Si or metal, etc.

The gate sidewall 52 is made of insulating material such as $SiO_2$.

The source/drain region 53 is formed by implanting a conductivity type impurity into the semiconductor substrate 1.

The through plug 101 is made of conductive material such as Cu. In addition, a barrier metal made of Ti, etc., may be formed on a surface of the through plug 101.

The through plug 101 has a two-stage structure containing an upper stage portion 101a on a front surface side of the semiconductor substrate 1 and a lower stage portion 101b under the upper stage portion 101a. The upper stage portion 101a is surrounded by the element isolation insulating film 2 and an insulating film 102 in the semiconductor substrate 1. The lower stage portion 101b has a diameter larger than that of the upper stage portion 101a, and an outer peripheral portion of the lower stage portion 101b is located underneath the element isolation insulating film 2. Such a two-stage structure is formed after formation of the element isolation insulating film 2 because a contact hole for the through plug 101 is formed using the element isolation insulating film 2 as a stopper. Alternatively, the through plug 101 may have a structure of three or more stages as long as the upper stage portion 101a and the lower stage portion 101b are included.

The insulating film 102 is made of insulating material such as $SiO_2$. The insulating film 102 is formed on a side face of the through plug 101 in order to isolate the through plug 101 from the semiconductor substrate 1.

The contact plugs 6, 7 and 103 are made of conductive material which contains, e.g., W, Cu, Al or Su as a principal element. In addition, a barrier metal made of Ti, etc., may be formed on a surface of the contact plugs 6, 7 and 103.

The wirings 8, 9 and the electrode pad 104 are made of conductive material such as Cu. A barrier metal made of Ti, etc., may be formed on surfaces of the wirings 8, 9 and the electrode pad 104.

An example of a method of fabricating the semiconductor device 100 according to the present embodiment will be described hereinafter.

FIGS. 3A to 3I are cross sectional views showing processes for fabricating the semiconductor device 100 according to the first embodiment.

Figure 3A:
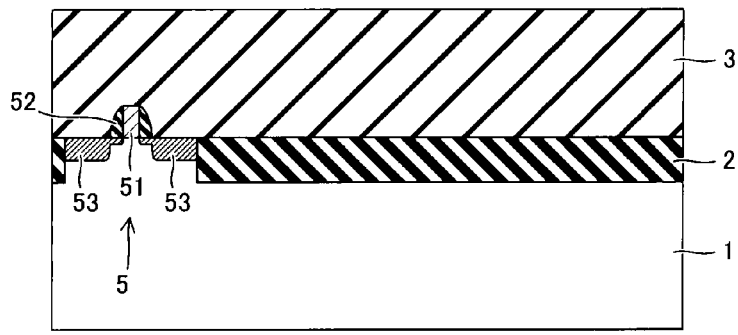
FIGS. 3A to 3I are cross sectional views showing processes for fabricating the semiconductor device according to the first embodiment.

Firstly, as shown in FIG. 3A, the element isolation insulating film 2 and the transistor 5 are formed on the semiconductor substrate 1, and then, the interlayer insulating film 3 is formed on the semiconductor substrate 1, the element isolation insulating film 2 and the transistor 5.

An insulating material is deposited on the entire surface of the semiconductor substrate 1 using CVD (Chemical Vapor Deposition) method and is subsequently planarized using CMP (Chemical Mechanical Polishing) method, which results in that the interlayer insulating film 3 is formed.

Figure 3B:
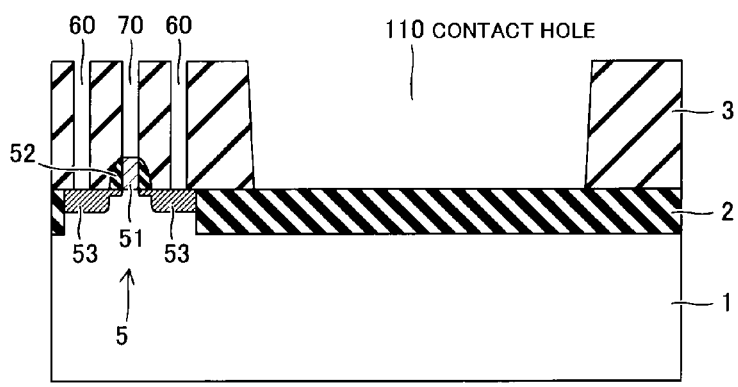

Next, as shown in FIG. 3B, contact holes 60, 70 and 110 are formed in the interlayer insulating film 3 by a combination of photolithography method and RIE method.

The interlayer insulating film 3 has a laminated structure composed of, e.g., a SiN film and a $SiO_2$ film thereon, and the SiN film functions as an etching stopper film at the time of forming the contact holes 60, 70 and 110. Therefore, it is possible to etch the $SiO_2$ film without generating etching damage to the element isolation insulating film 2. In addition, since the SiN film has sufficient etching selectivity with respect to the element isolation insulating film 2, it is possible to suppress the etching damage to the element isolation insulating film 2 when the SiN film is removed.

Figure 3C:
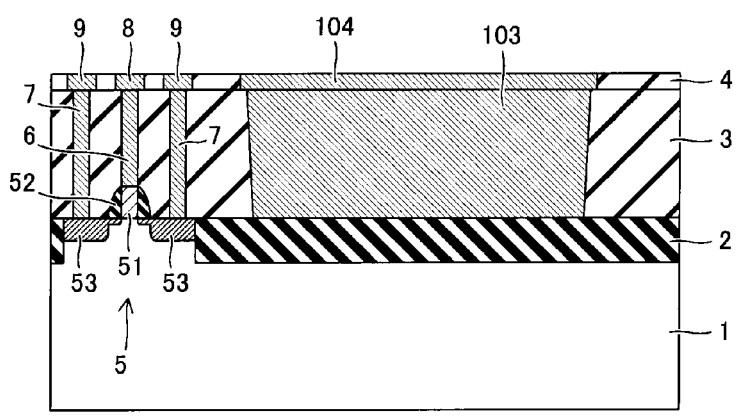

Next, as shown in FIG. 3C, the contact plugs 6, 7 and 103 are respectively formed in the contact holes 60, 70 and 110, and then, the interlayer insulating film 4, the wirings 8, 9 and the electrode pad 104 are formed thereon.

A conductive material is deposited on the entire surface of the semiconductor substrate 1 by PVD (Physical Vapor Deposition) method so as to fill the contact holes 60, 70 and 110 and is subsequently planarized using CMP method, which results in that the contact plugs 6, 7 and 103 are formed.

An insulating material is deposited on the interlayer insulating film 3 by CVD method, thereby forming the interlayer insulating film 4. Trenches are formed in the interlayer insulating film 4 by a combination of photolithography method and RIE method, and a conductive material is filled in the trenches by PVD method and is subsequently planarized by CMP method, which results in that the wirings 8, 9 and the electrode pad 104 are formed.

Figure 3D:
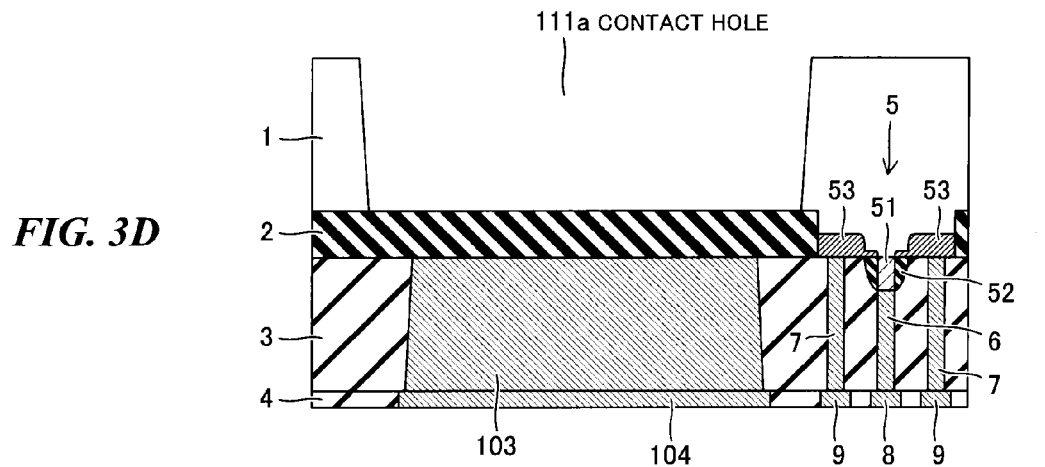

Next, as shown in FIG. 3D, a contact hole 111a is formed by etching the back surface of the semiconductor substrate 1.

In detail, after a non-illustrated supporting substrate is laminated on an upper surface of the interlayer insulating film 4 (in case that another layer is formed on the interlayer insulating film 4, it is laminated on an upper surface thereof), the semiconductor substrate 1 is turned over so that the back surface faces upwards. Next, although it is not shown in the figure, the back surface of the semiconductor substrate 1 is subjected to polishing process or wet treatment, thereby thinning the semiconductor substrate 1 to about 50 μm. Next, the contact hole 111a is formed by a combination of photolithography method and RIE method. At this time, the element isolation insulating film 2 functions as an etching stopper, thereby preventing the bottom surface of the contact plug 103 (a surface in contact with the element isolation insulating film 2) from being etched.

Figure 3E:
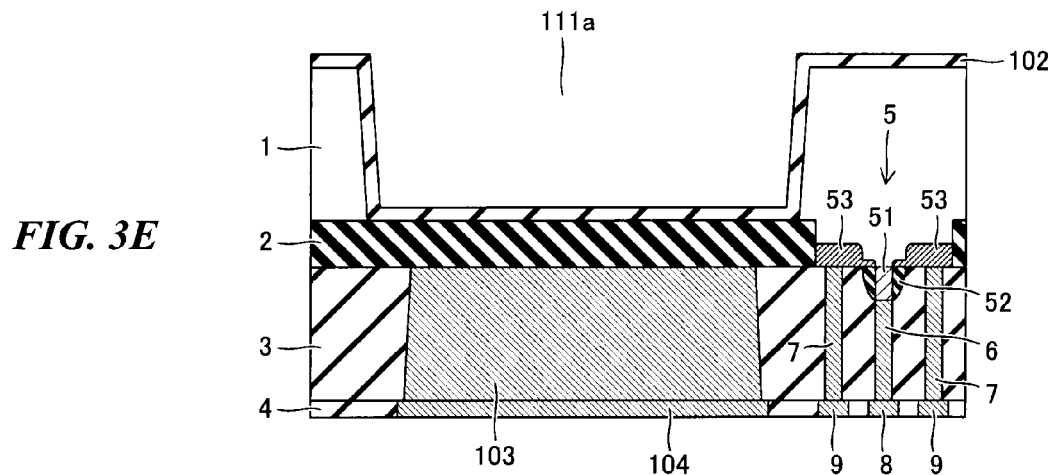

Next, as shown in FIG. 3E, the insulating film 102 is formed so as to cover an inner surface of the contact hole 111a.

The insulating film 102 is formed by depositing an insulating material by CVD method.

Figure 3F:
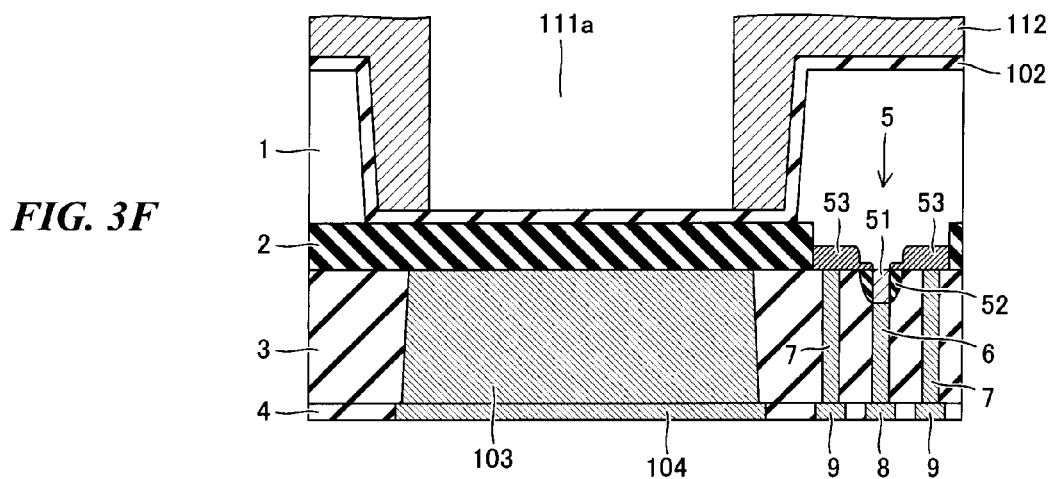

Next, as shown in FIG. 3F, an etching mask 112 of which opening pattern is a pattern of the upper stage portion 101a of the through plug 101 is formed by photolithography method.

Here, the etching mask 112 is formed so as to cover the insulating film 102 on the side face of the contact hole 111a so that the etching does not reach thereto in the next etching process. Therefore, the opening diameter of the etching mask 112 (a diameter of the upper stage portion 101a of the through plug 101) is smaller than the diameter of the contact hole 111a having the insulating film 102 formed on the inner surface thereof.

Note that, when the etching mask 112 is formed so as to exactly cover the insulating film 102 on the side face of the contact hole 111a, the opening diameter of the etching mask 112 is equal to a diameter of a bottom of the contact hole 111a having the insulating film 102 formed on the inner surface thereof. In this case, no step is formed between the upper stage portion 101a and the lower stage portion 101b.

Figure 3G:
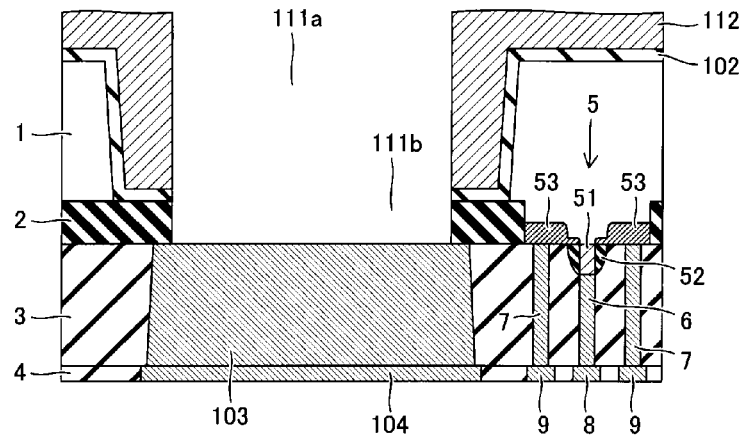

Next, as shown in FIG. 3G, the insulating film 102 and the element isolation insulating film 2 on the bottom of the contact hole 111a are etched by RIE method using the etching mask 112 as mask, thereby forming a contact hole 111b. At this time, since the insulating film 102 and the element isolation insulating film 2 have sufficient etching selectivity with respect to the contact plug 103, it is possible to form the contact hole 111b while suppressing the etching damage to the bottom surface of the contact plug 103.

Figure 3H:
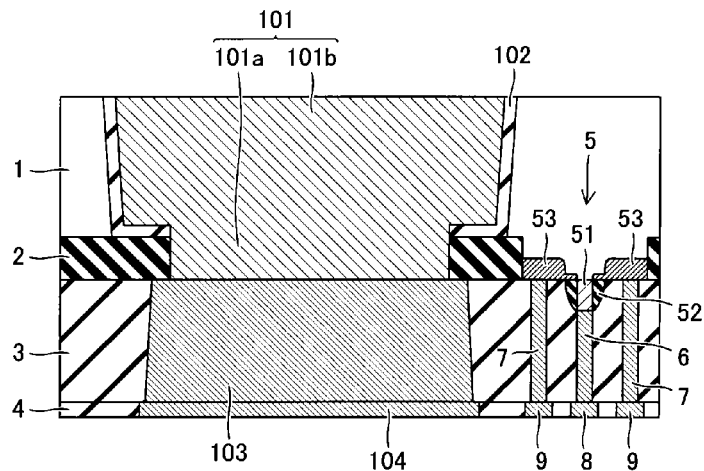

Next, as shown in FIG. 3H, after the etching mask 112 is removed, the through plug 101 is formed by filling the contact holes 111a and 111b with a conductive material.

Here, a portion of the conductive material filled in the contact hole 111b becomes the upper stage portion 101a, and a portion filled in the contact hole 111a becomes the lower stage portion 101b.

When the through plug 101 is formed using Cu, at first, a barrier metal made of Ti, etc., and a Cu seed film are formed so as to cover inner surfaces of the contact holes 111a and 111b. Next, a mask is formed on a region of the seed film outside of the contact holes 111a and 111b and Cu is subsequently plated, thereby forming the through plug 101 in the contact holes 111a and 111b. Next, the regions of the seed film, the barrier metal and the insulating film 102 outside of the contact holes 111a and 111b are removed, using the through plug 101 as a mask, by wet etching using acid etchant.

Figure 3I:
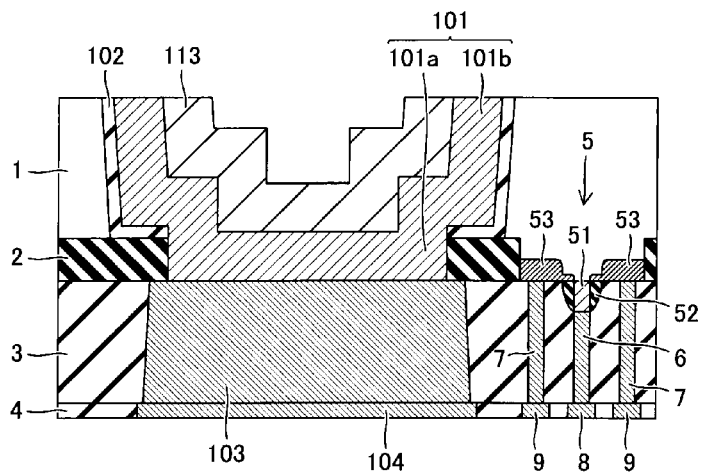

Alternatively, as shown in FIG. 3I, a protective resin 113 made of a resin such as epoxy may be formed on an inner surface of the through plug 101 in the contact holes 111a and 111b.

Effect of the First Embodiment

According to the first embodiment, it is possible to suppress the etching damage to the bottom surface of the contact plug 103 by using the element isolation insulating film 2 as an etching stopper at the time of forming the contact hole 111a for the through plug 101 (see FIG. 3D).

Figure 17A:
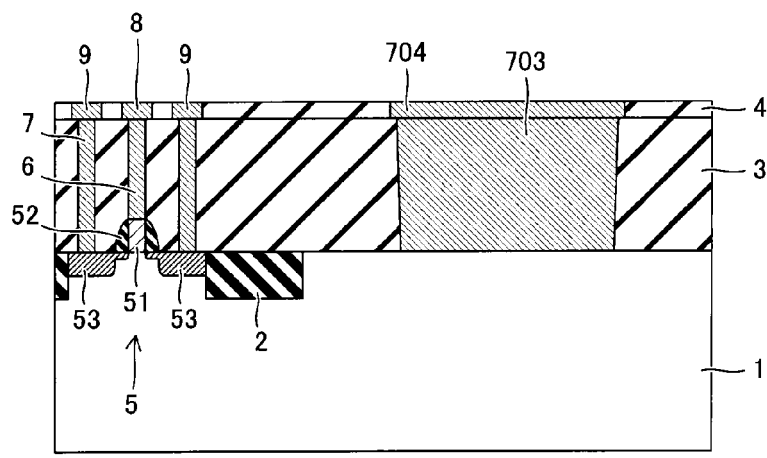
FIGS. 17A and 17B are cross sectional views showing processes for fabricating a semiconductor device according to the prior art.
Figure 17B:
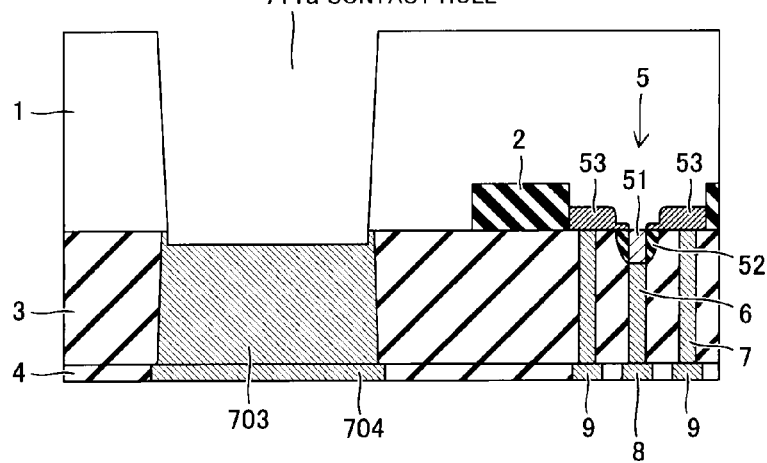

As in a conventional semiconductor device, in case that a contact plug 703 in the interlayer insulating film 3 which is connected to a through plug is formed directly on the semiconductor substrate 1 in a region where the interlayer insulating film 3 is not formed (see FIG. 17A), there is a possibility that the etching reaches not only the semiconductor substrate 1 but also a bottom surface of the contact plug 703 at the time of forming a contact hole 711a for the through plug by etching the semiconductor substrate 1 because there is not stopper, which may result in damage on the bottom surface of the contact plug 703 (see FIG. 17B). For example, when the contact plug 703 is made of W, since $SF_6$ gas used for processing Si of the semiconductor substrate 1 also etches W, such problem occurs.

When the etching damage is generated on the bottom surface of the contact plug, the contact plug is not appropriately connected to the through plug, thus, there is a possibility that electrical resistance at a connection increases. Furthermore, there is a risk that the contact plug does not electrically connect to the through plug.

Second Embodiment

The second embodiment is different from the first embodiment in that an interlayer insulating film is formed after formation of a dummy gate electrode in a region on an element isolation insulating film for forming a contact plug. Note that, the explanations will be omitted or simplified for the points same as the first embodiment.

An example of a method of fabricating a semiconductor device according to the present embodiment will be described hereinafter.

Figure 4A:
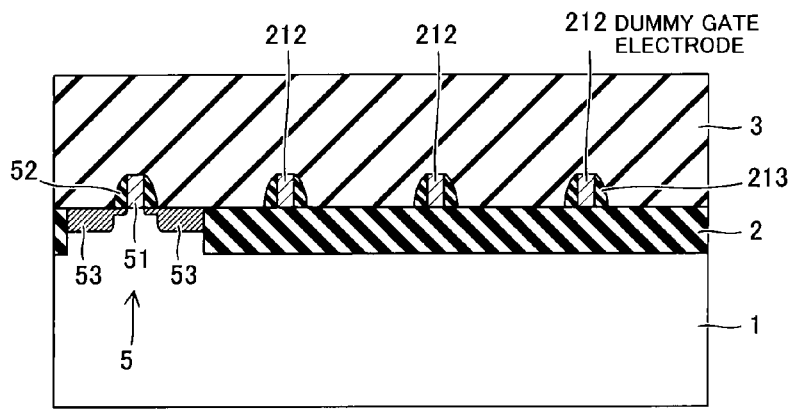
FIGS. 4A to 4C are cross sectional views showing processes for fabricating a semiconductor device according to a second embodiment.
Figure 4B:
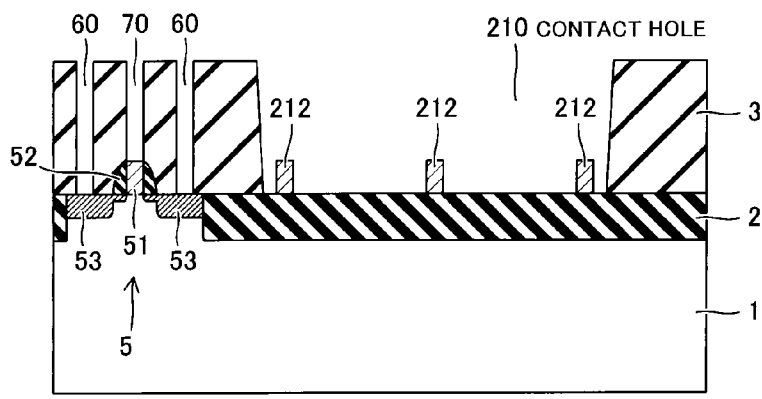
Figure 4C:
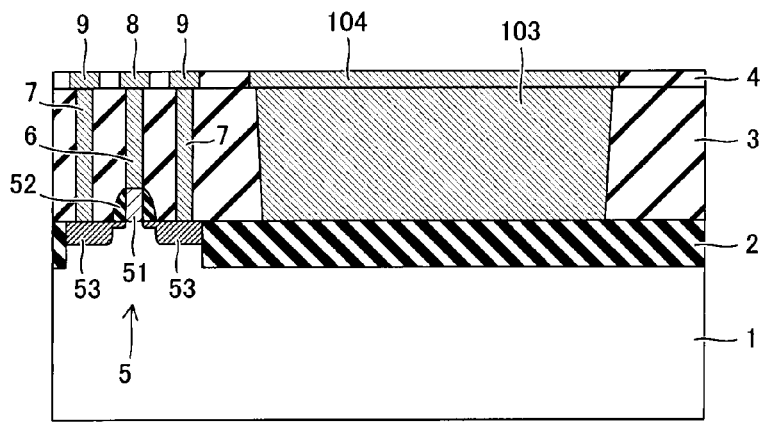

FIGS. 4A to 4C are cross sectional views showing processes for fabricating a semiconductor device according to a second embodiment.

Firstly, as shown in FIG. 4A, the element isolation insulating film 2, the transistor 5 and a dummy gate electrode 212 are formed on the semiconductor substrate 1, and then, the interlayer insulating film 3 is formed on the semiconductor substrate 1, the element isolation insulating film 2, the transistor 5 and the dummy gate electrode 212.

An insulating material is deposited on the entire surface of the semiconductor substrate 1 by CVD method and is subsequently planarized by CMP method, which results in that the interlayer insulating film 3 is formed.

Here, the dummy gate electrode 212 is made of the same material as the gate electrode 51 and can be simultaneously formed with the gate electrode 51. Meanwhile, a gate sidewall 213 on the side face of the dummy gate electrode 212 is made of the same material as the gate sidewall 52 and can be simultaneously formed with the gate sidewall 52.

By forming the dummy gate electrode 212, it is possible to reduce bias in distribution of a concavo-convex pattern on a base of the interlayer insulating film 3 and to suppress generation of local recesses (hereinafter, referred to as "dishing") at the time of performing planarization treatment on the interlayer insulating film 3.

In case that the dummy gate electrode 212 is not formed, since the upper side of the element isolation insulating film 2 is flat while a convex portion due to the gate electrode 51 is present in a region where the transistor 5 is formed, the dishing is likely to be generated in a region of the interlayer insulating film 3 on the element isolation insulating film 2. If the dishing is generated, light is not focused on the recess at the time of exposure when a member on the interlayer insulating film 3 is patterned using the lithography method, thus, a pattern shape is deformed.

Next, as shown in FIG. 4B, contact holes 60, 70 and 210 are formed in the interlayer insulating film 3 by a combination of photolithography method and RIE method. The gate sidewalls 213 may be removed at this time.

Next, as shown in FIG. 4C, the contact plugs 6, 7 and 103 are respectively formed in the contact holes 60, 70 and 210 after the dummy gate electrode 212 is removed by etching, and then, the interlayer insulating film 4, the wirings 8, 9 and the electrode pad 104 are formed thereon.

Alternatively, the dummy gate electrode 212 may be left without being removed. In this case, it is possible to use the dummy gate electrode 212 as an etching end point for detecting plasma emission during the etching in a posterior process of forming the contact hole 111b.

After that, a semiconductor device having the same configuration as the semiconductor device 100 of the first embodiment is formed through the same processes as the first embodiment.

Effect of the Second Embodiment

According to the second embodiment, it is possible to suppress the generation of the dishing in the interlayer insulating film 3 by forming the dummy gate electrode 212. As a result, it is possible to accurately pattern an upper member of the interlayer insulating film 3 using the lithography method.

Third Embodiment

The third embodiment is different from the first embodiment in patterns of a contact plug and an electrode pad. Note that, the explanations will be omitted or simplified for the points same as the first embodiment.

Figure 5:
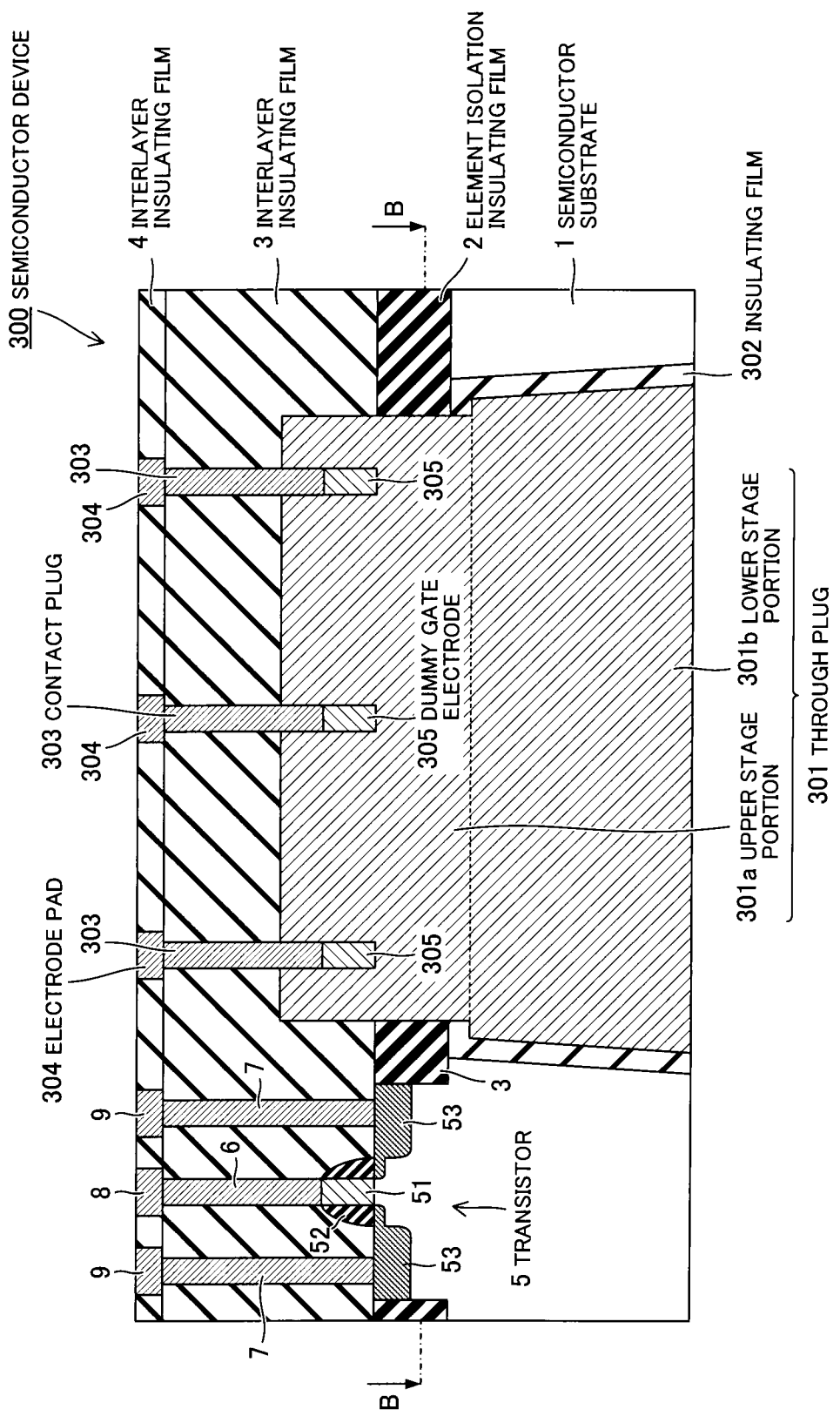
FIG. 5 is a cross sectional view of a semiconductor device according to a third embodiment.
Figure 6A:
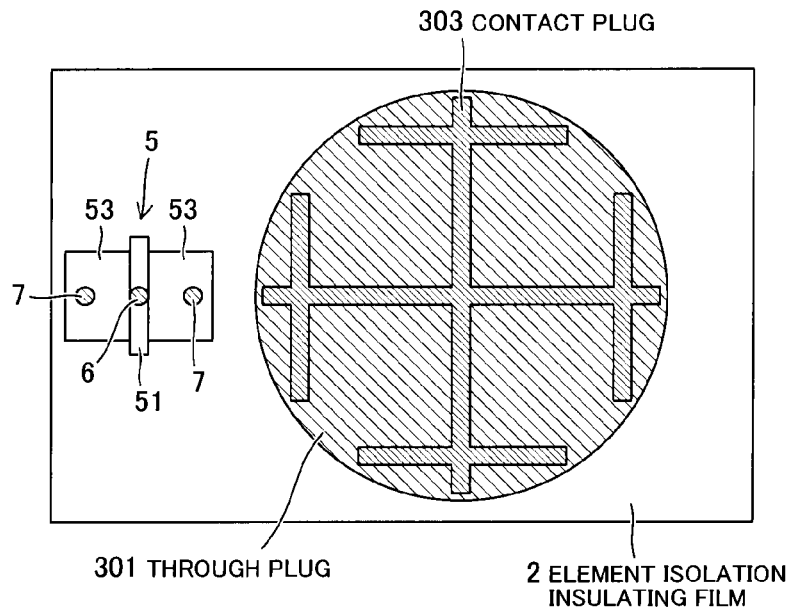
FIGS. 6A and 6B are views of the semiconductor device according to the third embodiment, which are respectively a plan view and a cross sectional view taken on line B-B of FIG. 5.
Figure 6B:
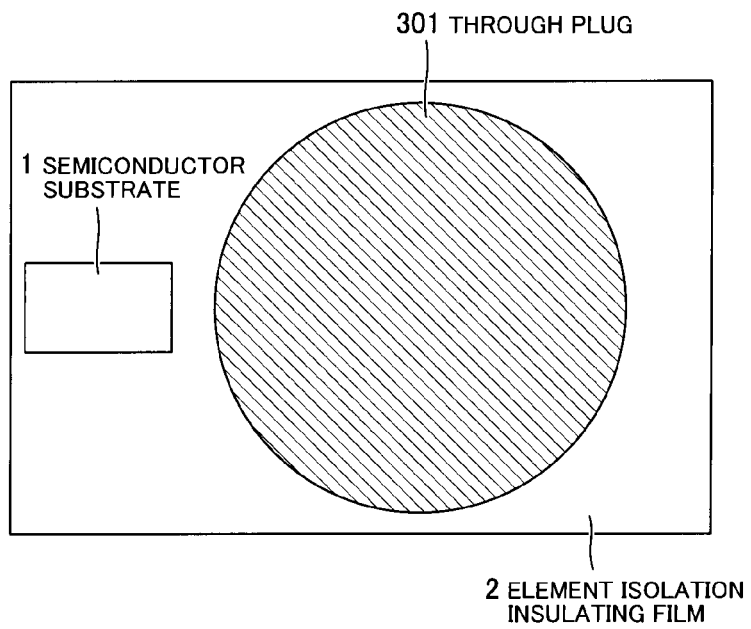

FIG. 5 is a cross sectional view of a semiconductor device 300 according to a third embodiment. In addition, FIG. 6A is a plan view of the semiconductor device 300 and FIG. 6B is a cross sectional view of the semiconductor device 300 taken on line B-B of FIG. 5. Note that, illustrations of below-described interlayer insulating films 3 and 4, wirings 8 and 9, an electrode pad 304 and a gate sidewall 52 are omitted in FIG. 6A.

A semiconductor device 300 has a transistor 5 formed on a semiconductor substrate 1 and electrically isolated from other elements by an element isolation insulating film 2, interlayer insulating films 3 and 4 formed on the semiconductor substrate 1, a through plug 301 penetrating the semiconductor substrate 1 from a back surface to a front surface, an electrode pad 304 formed in the interlayer insulating film 4, a dummy gate electrode 305 connected to the through plug 301, and a contact plug 303 formed in the interlayer insulating film 3 for connecting the dummy gate electrode 305 to the electrode pad 304.

The through plug 301 is made of conductive material such as Cu. In addition, a barrier metal made of Ti, etc., may be formed on a surface of the through plug 301.

The through plug 301 has a two-stage structure containing an upper stage portion 301a on a front surface side of the semiconductor substrate 1 and a lower stage portion 301b under the upper stage portion 301a. The upper stage portion 301a is surrounded by the element isolation insulating film 2 and an insulating film 302 in the semiconductor substrate 1. The lower stage portion 301b has a diameter larger than that of the upper stage portion 301a, and an outer peripheral portion of the lower stage portion 301b is located underneath the element isolation insulating film 2. Alternatively, the through plug 301 may have a structure of three or more stages as long as the upper stage portion 301a and the lower stage portion 301b are included.

It is necessary that the through plug 301 is in contact with the dummy gate electrode 305. In addition, the through plug 301 is preferably in contact with both of the dummy gate electrode 305 and the contact plug 303 in order to decrease electrical resistance at a connection.

The insulating film 302 has the same configuration as the insulating film 102 in the first embodiment.

The contact plug 303 is made of conductive material which contains, e.g., W, Cu, Al or Su as a principal element. In addition, a barrier metal made of Ti, etc., may be formed on a surface of the contact plug 303. The contact plug 303 is connected to the dummy gate electrode 305. In addition, the contact plug 303 can be made of the same material and formed in the same process as the contact plugs 6 and 7.

The electrode pad 304 is made of conductive material such as Cu. In addition, a barrier metal made of Ti, etc., may be formed on a surface of the electrode pad 304.

The dummy gate electrode 305 is made of the same material as the gate electrode 51 and can be simultaneously formed with the gate electrode 51. In addition, when the dummy gate electrode 305 is made of Si-based crystal, the dummy gate electrode 305 is preferably a fully silicided electrode in which the entire region is metal silicide. Co, Ni, Mn, Fe, Cu, Ta, Nb, Hf, Zr, Cr, Ru, Ir, Pt, Rh or Pd, etc., can be used as a metal of the metal silicide.

As shown in FIG. 6A, the contact plug 303 has a lattice pattern. Since a large area region is not thus included in the pattern, it is possible to suppress the generation of the dishing in the contact plug 303. The dummy gate electrode 305 has the same pattern as the contact plug 303.

In addition, the electrode pad 304 may have a plate-like shape, however, it is preferable to have the same pattern as the contact plug 303 in order to suppress the generation of the dishing.

Figure 7A:
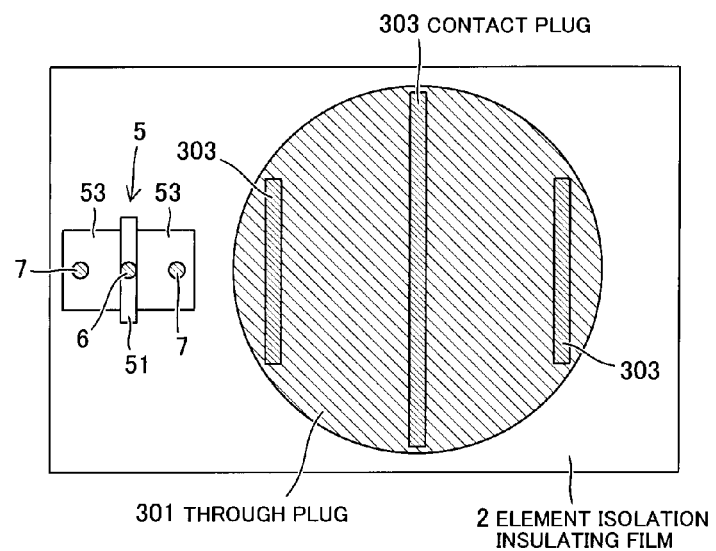
FIGS. 7A and 7B are plan views of a semiconductor device according to a modification of the third embodiment.

Alternatively, similarly to the gate electrode 51, the contact plug 303 may have a line-and-space pattern as shown in FIG. 7A.

Figure 7B:
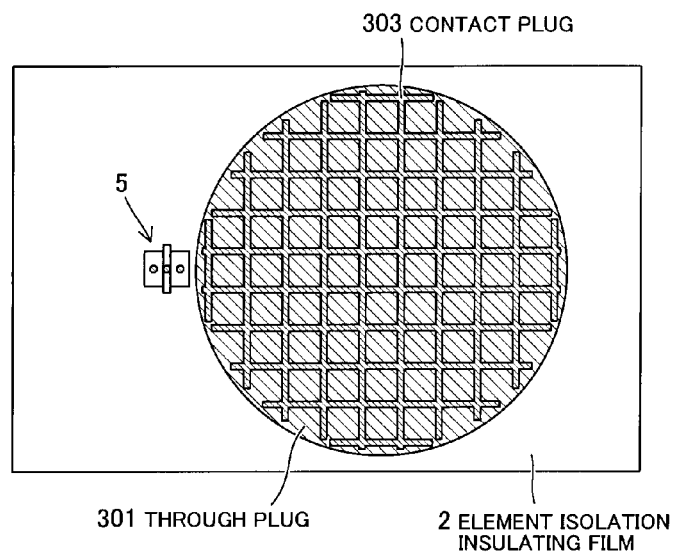

In addition, the number of lattices in the lattice pattern of the contact plug 303 is not limited to that shown in FIG. 6A. For example, as shown in FIG. 7B, the number of lattices may increase by increasing a diameter of the contact plug 303. In addition, the pattern is not necessarily continuous, and it may be a pattern, e.g., in which plural dot patterns are aligned in a lattice form.

Figure 8:
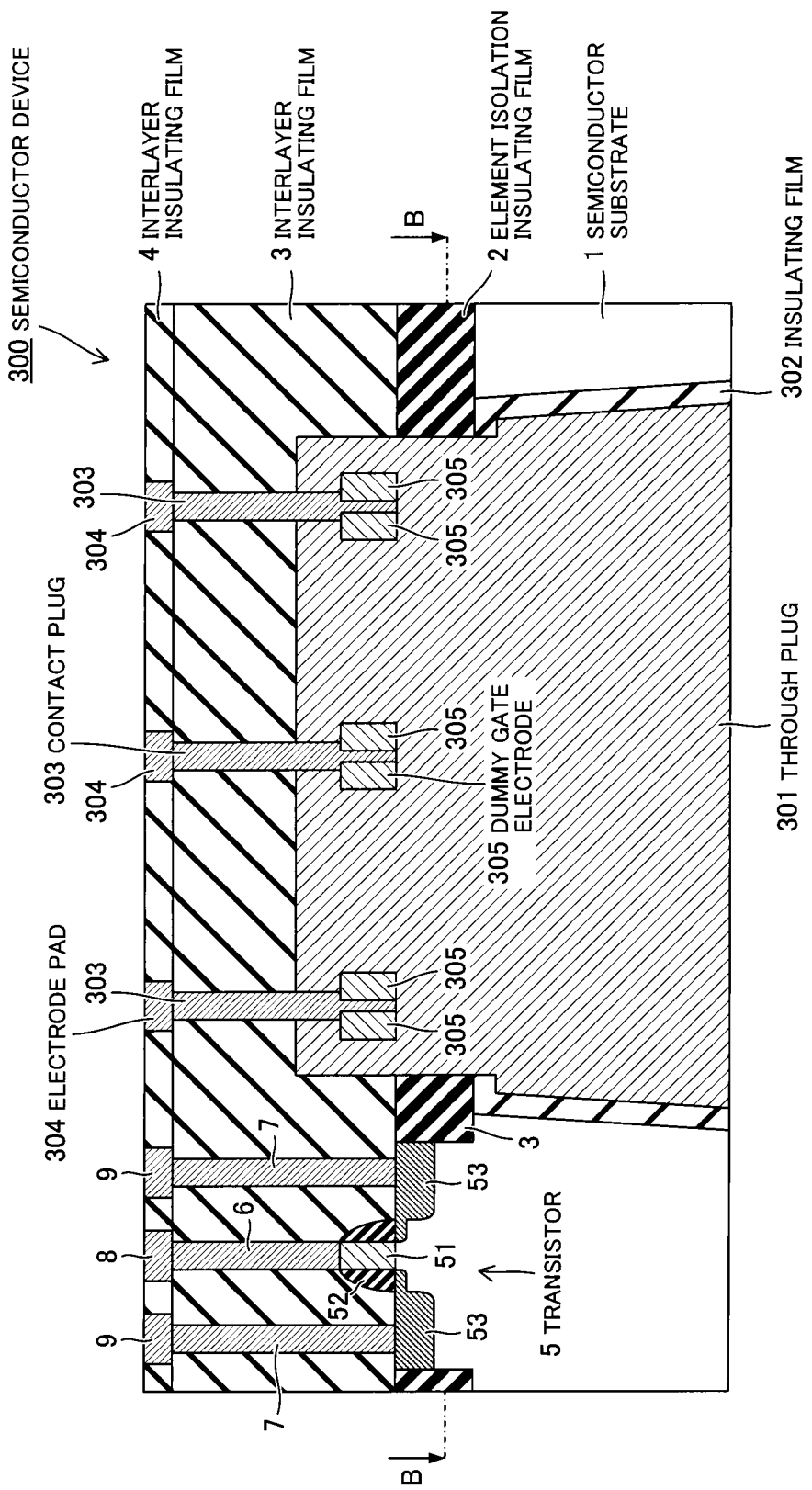
FIG. 8 is a cross sectional view of the semiconductor device according to the modification of the third embodiment.

In addition, as shown in FIG. 8, one line of the pattern of the contact plug 303 may be composed of two dummy gate electrodes 305 having a narrow space therebetween. In this case, a lower portion of the contact plug 303 enters between the two dummy gate electrodes 305 and the bottom surface of the contact plug 303 contacts with the through plug 301.

An example of a method of fabricating the semiconductor device 300 according to the present embodiment will be described hereinafter.

FIGS. 9A to 9H are cross sectional views showing processes for fabricating the semiconductor device 300 according to the third embodiment.

Figure 9A:
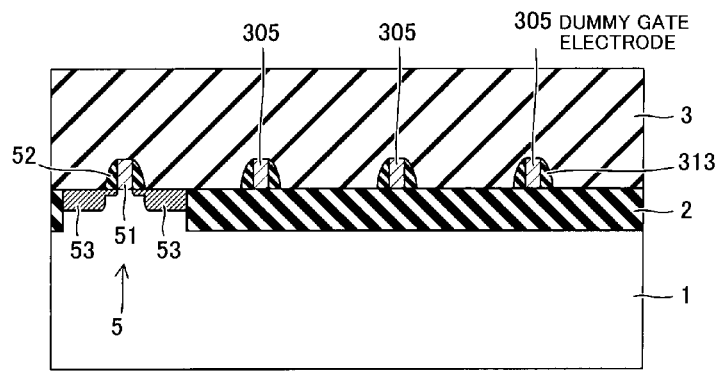
FIGS. 9A to 9H are cross sectional views showing processes for fabricating the semiconductor device according to the third embodiment.

Firstly, as shown in FIG. 9A, the element isolation insulating film 2, the transistor 5 and the dummy gate electrode 305 are formed on the semiconductor substrate 1, and then, the interlayer insulating film 3 is formed on the semiconductor substrate 1, the element isolation insulating film 2, the transistor 5 and the dummy gate electrode 305.

An insulating material is deposited on the entire surface of the semiconductor substrate 1 by CVD method and is subsequently planarized by CMP method, which results in that the interlayer insulating film 3 is formed.

Here, the dummy gate electrode 305 is made of the same material as the gate electrode 51 and can be simultaneously formed with the gate electrode 51. Meanwhile, a gate sidewall 313 on the side face of the dummy gate electrode 305 is made of the same material as the gate sidewall 52 and can be simultaneously formed with the gate sidewall 52.

It is possible to suppress the generation of the dishing in the interlayer insulating film 3 by forming the dummy gate electrode 305.

Figure 9B:
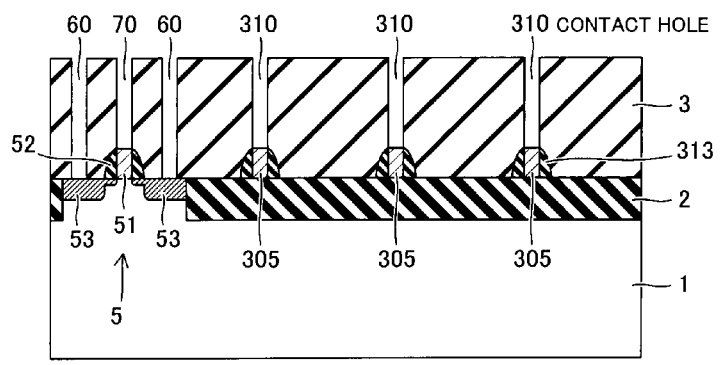

Next, as shown in FIG. 9B, contact holes 60, 70 and 310 are formed in the interlayer insulating film 3 by a combination of photolithography method and RIE method. Here, an opening pattern of the contact hole 310 is substantially same as a pattern of the dummy gate electrode 305.

Figure 9C:
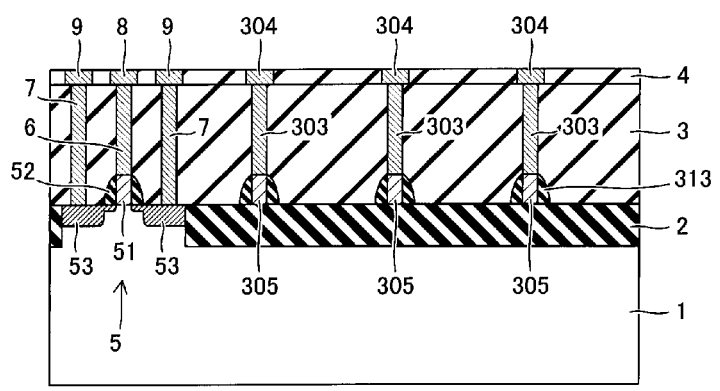

Next, as shown in FIG. 9C, the contact plugs 6, 7 and 303 are respectively formed in the contact holes 60, 70 and 310, and then, the interlayer insulating film 4, the wirings 8, 9 and the electrode pad 304 are formed thereon.

A conductive material is deposited on the entire surface of the semiconductor substrate 1 using PVD method so as to fill the contact hole 310 and is subsequently planarized by CMP method, which results in that the contact plug 303 is formed. Here, since a large area region does not exist in the pattern of the contact plug 303, it is possible to suppress the generation of the dishing in the contact plug 303.

Trenches are formed in the interlayer insulating film 4 by a combination of photolithography method and RIE method, and a conductive material is filled in the trenches by PVD method and is subsequently planarized by CMP method, which results in that the electrode pad 304 is formed. Here, since the pattern of the electrode pad 304 is substantially same as the pattern of the contact plug 303 and a large area region does not exist, it is possible to suppress the generation of the dishing in the electrode pad 304.

Figure 9D:
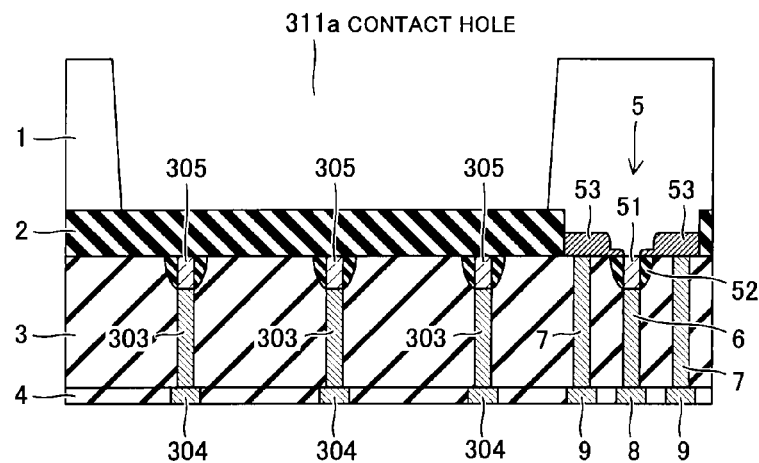

Next, as shown in FIG. 9D, a contact hole 311a is formed by etching the back surface of the semiconductor substrate 1.

In detail, after a non-illustrated supporting substrate is laminated on an upper surface of the interlayer insulating film 4 (in case that another layer is formed on the interlayer insulating film 4, it is laminated on an upper surface thereof), the semiconductor substrate 1 is turned over so that the back surface faces upwards. Next, although it is not shown in the figure, the back surface of the semiconductor substrate 1 is subjected to polishing process or wet treatment, thereby thinning the semiconductor substrate 1 to about 50 μm. Next, the contact hole 311a is formed by a combination of photolithography method and RIE method. At this time, the element isolation insulating film 2 functions as an etching stopper, thereby preventing the bottom surface of the dummy gate electrode 305 (a surface in contact with the element isolation insulating film 2) from being etched.

Figure 9E:
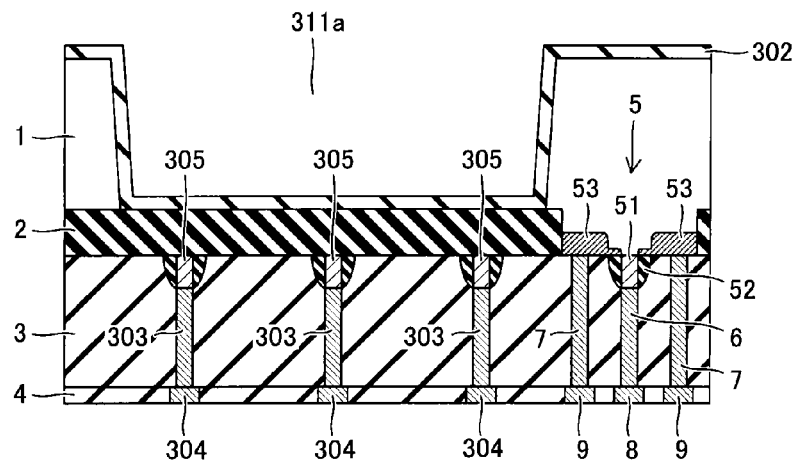

Next, as shown in FIG. 9E, the insulating film 302 is formed so as to cover an inner surface of the contact hole 311a.

Figure 9F:
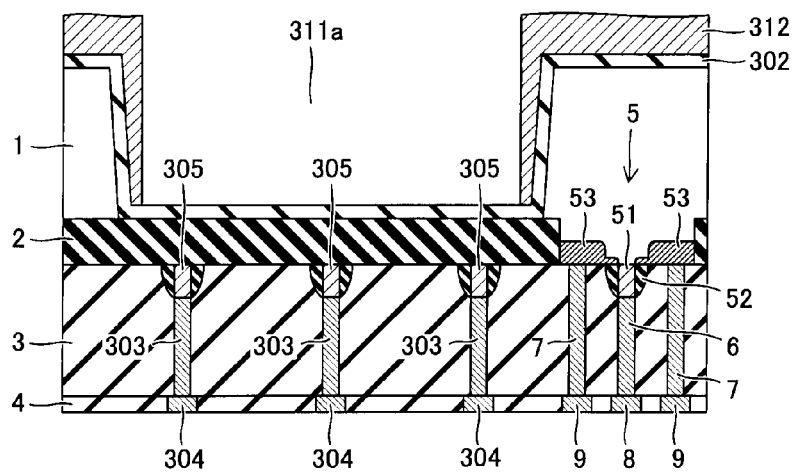

Next, as shown in FIG. 9F, an etching mask 312 of which opening pattern is a pattern of the upper stage portion 301a of the through plug 301 is formed by photolithography method.

Here, the etching mask 312 is formed so as to cover the insulating film 302 on the side face of the contact hole 311a so that the etching does not reach thereto in the next etching process. Therefore, the opening diameter of the etching mask 312 (a diameter of the upper stage portion 301a of the through plug 301) is smaller than the diameter of the contact hole 311a having the insulating film 302 formed on the inner surface thereof.

Note that, when the etching mask 312 is formed so as to exactly cover the insulating film 302 on the side face of the contact hole 311a, the opening diameter of the etching mask 312 is equal to a diameter of a bottom of the contact hole 311a having the insulating film 302 formed on the inner surface thereof. In this case, no step is formed between the upper stage portion 301a and the lower stage portion 301b.

Figure 9G:
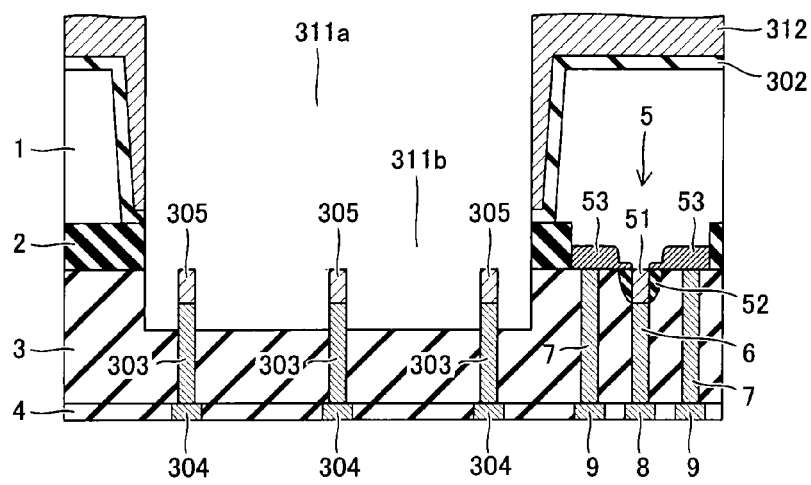

Next, as shown in FIG. 9G, the insulating film 302 and the element isolation insulating film 2 on the bottom of the contact hole 311a are etched by RIE method using the etching mask 312 as mask, thereby forming a contact hole 311b.

At this time, it is possible to use the dummy gate electrode 305 as an etching end point for detecting plasma emission during the etching. Furthermore, when the through plug 301 is formed in contact with both of the dummy gate electrode 305 and the contact plug 303, the etching of the interlayer insulating film 3 is continued after the bottom of the dummy gate electrode 305 is exposed on a bottom of the contact hole 311b so that the bottom of the contact hole 311b is located on the contact plug 303 side from the boundary between the dummy gate electrode 305 and the contact plug 303.

Figure 9H:
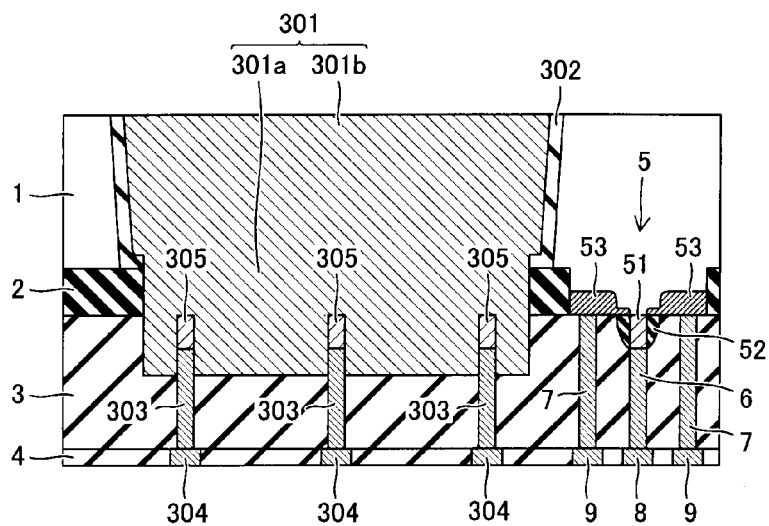

Next, as shown in FIG. 9H, after the etching mask 312 is removed, the through plug 301 is formed by filling the contact holes 311a and 311b with a conductive material.

Here, a portion of the conductive material filled in the contact hole 311b becomes the upper stage portion 301a, and a portion filled in the contact hole 311a becomes the lower stage portion 301b.

Effect of the Third Embodiment

According to the third embodiment, it is possible to suppress the generation of the dishing in the interlayer insulating film 3 by forming the dummy gate electrode 305.

In addition, since the pattern of the contact plug 303 and the electrode pad 304 is a pattern which does not include a large area region, such as a lattice pattern, it is possible to suppress the generation of the dishing in the contact plug 303 and the electrode pad 304.

Fourth Embodiment

The fourth embodiment is different from the third embodiment in a pattern of an element isolation insulating film. Note that, the explanations will be omitted or simplified for the points same as the third embodiment.

An example of a method of fabricating the semiconductor device according to the present embodiment will be described hereinafter.

FIGS. 10A to 10D are cross sectional views showing processes for fabricating a semiconductor device according to a fourth embodiment.

Figure 10A:
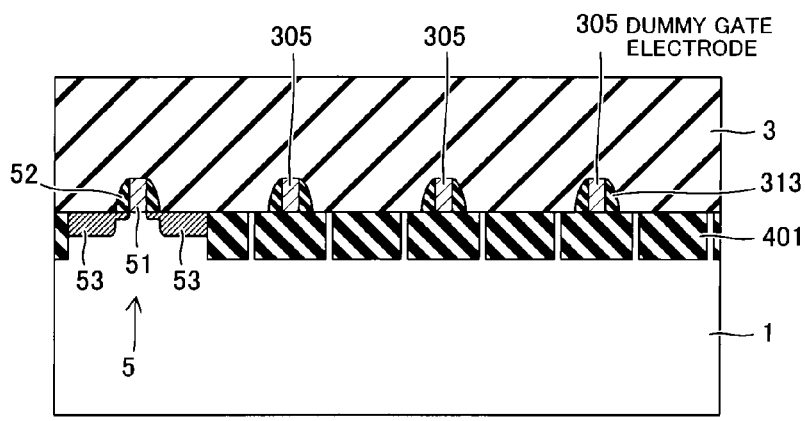
FIGS. 10A to 10D are cross sectional views showing processes for fabricating a semiconductor device according to a fourth embodiment.

Firstly, as shown in FIG. 10A, an element isolation insulating film 401, a transistor 5 and a dummy gate electrode 305 are formed on the semiconductor substrate 1, and then, the interlayer insulating film 3 is formed on the semiconductor substrate 1, the element isolation insulating film 401, the transistor 5 and the dummy gate electrode 305.

Here, the element isolation insulating film 401 is composed of plural insulating films arranged in a horizontal direction. Since a divided individual insulating film does not have a large area, it is possible to suppress the generation of the dishing in the element isolation insulating film 401.

Figure 10B:
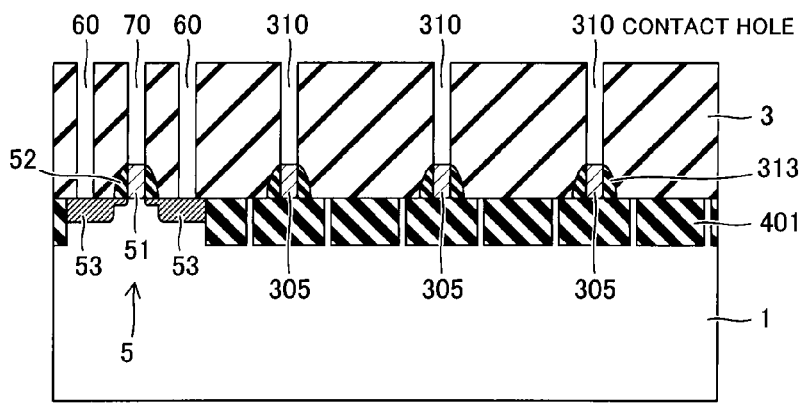

Next, as shown in FIG. 10B, contact holes 60, 70 and 310 are formed in the interlayer insulating film 3 by a combination of photolithography method and RIE method.

Figure 10C:
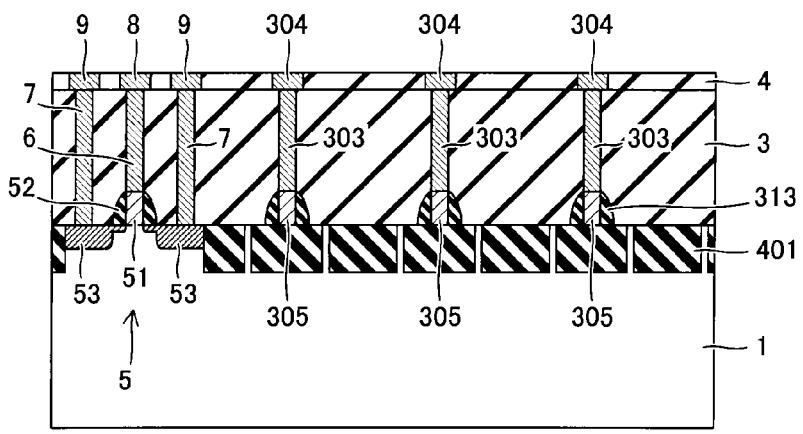

Next, as shown in FIG. 10C, the contact plugs 6, 7 and 303 are respectively formed in the contact holes 60, 70 and 310, and then, the interlayer insulating film 4, the wirings 8, 9 and the electrode pad 304 are formed thereon.

Figure 10D:
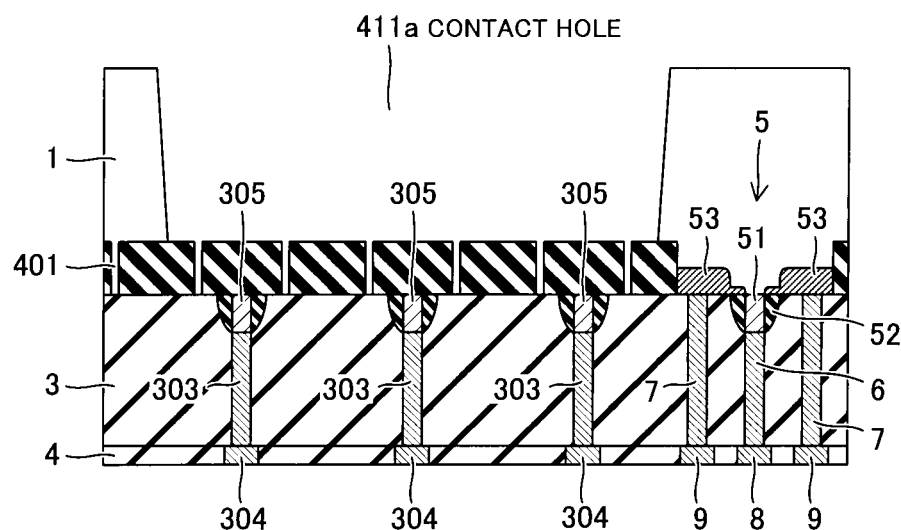

Next, as shown in FIG. 10D, a contact hole 411a is formed by etching the back surface of the semiconductor substrate 1.

In detail, after a non-illustrated supporting substrate is laminated on an upper surface of the interlayer insulating film 4 (in case that another layer is formed on the interlayer insulating film 4, it is laminated on an upper surface thereof), the semiconductor substrate 1 is turned over so that the back surface faces upwards. Next, although it is not shown in the figure, the back surface of the semiconductor substrate 1 is subjected to polishing process or wet treatment, thereby thinning the semiconductor substrate 1 to about 50 μm. Next, the contact hole 411a is formed by a combination of photolithography method and RIE method. At this time, the element isolation insulating film 401 functions as an etching stopper, thereby preventing the bottom surface of the dummy gate electrode 305 (a surface in contact with the element isolation insulating film 2) from being etched.

Note that, since a region between the individual insulating films in the element isolation insulating film 401 is a portion of the semiconductor substrate 1, it is removed at the same time as formation of the contact hole 411a, however, the etching to this region is stopped at the interlayer insulating film 3.

After that, a semiconductor device having the same configuration as the semiconductor device 300 of the third embodiment is formed through the same processes as the third embodiment.

Effect of the Fourth Embodiment

According to the fourth embodiment, since the element isolation insulating film 401 is composed of plural divided insulating films, it is possible to suppress the generation of the dishing in the element isolation insulating film 401.

Fifth Embodiment

The fifth embodiment is different from the first embodiment in a configuration of the through plug. Note that, the explanations will be omitted or simplified for the points same as the first embodiment.

Figure 11:
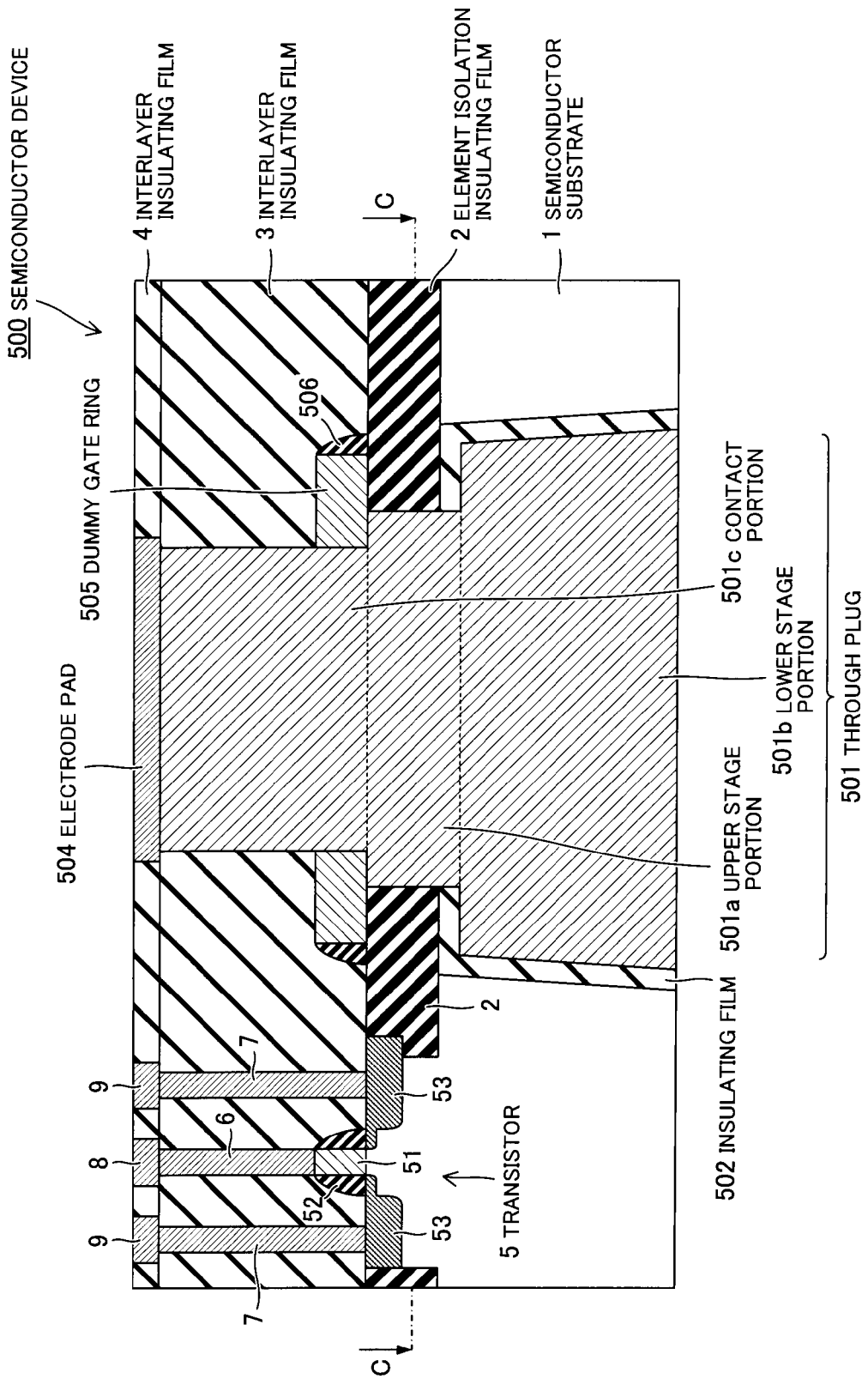
FIG. 11 is across sectional view of a semiconductor device according to a fifth embodiment.
Figure 12A:
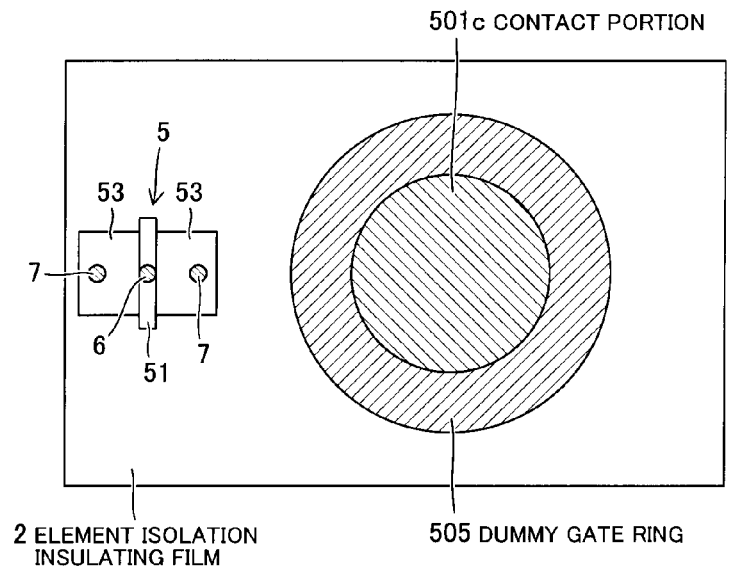
FIGS. 12A and 12B are views of the semiconductor device according to the fifth embodiment, which are respectively a plan view and a cross sectional view taken on line C-C of FIG. 11.
Figure 12B:
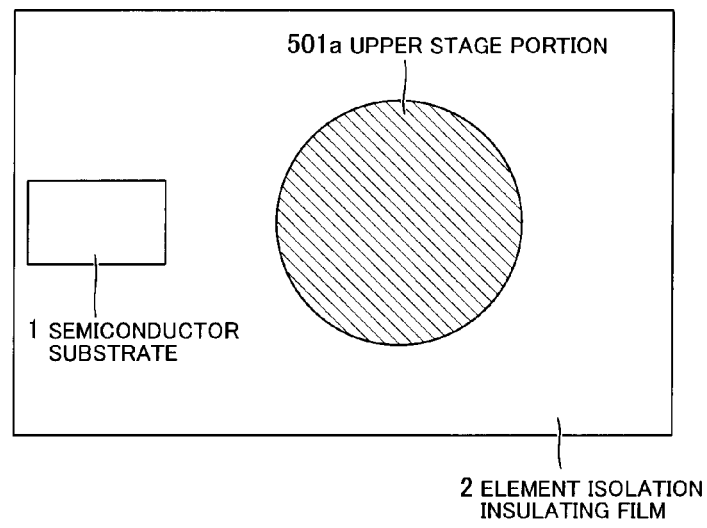

FIG. 11 is a cross sectional view of a semiconductor device 500 according to a fifth embodiment. In addition, FIG. 12A is a plan view of the semiconductor device 500 and FIG. 12B is a cross sectional view of the semiconductor device 500 taken on line C-C of FIG. 11. Note that, illustrations of below-described interlayer insulating films 3 and 4, wirings 8 and 9, an electrode pad 504 and gate sidewalls 52 and 506 are omitted in FIG. 12A.

A semiconductor device 500 has a transistor 5 formed on a semiconductor substrate 1 and electrically isolated from other elements by an element isolation insulating film 2, interlayer insulating films 3 and 4 formed on the semiconductor substrate 1, an electrode pad 504 formed in the interlayer insulating film 4, a through plug 501 penetrating the semiconductor substrate 1 as well as the interlayer insulating film 3 and connected to the electrode pad 504, and a dummy gate ring 505 surrounding a periphery of the through plug 501 in the interlayer insulating film 3.

The through plug 501 is made of conductive material such as Cu. In addition, a barrier metal made of Ti, etc., may be formed on a surface of the through plug 501.

The through plug 501 contains an upper stage portion 501a and a lower stage portion 501b in the semiconductor substrate 1 and a contact portion 501c in the interlayer insulating film 3, and has a structure such that the through plug 101 and the contact plug 103 in the first embodiment are integrally formed.

The through plug 501 has a two-stage structure containing an upper stage portion 501a on a front surface side of the semiconductor substrate 1 and a lower stage portion 501b under the upper stage portion 501a. The upper stage portion 501a is surrounded by the element isolation insulating film 2 and the insulating film 502 in the semiconductor substrate 1. The lower stage portion 501b has a diameter larger than that of the upper stage portion 501a, and an outer peripheral portion of the lower stage portion 501b is located underneath the element isolation insulating film 2. Alternatively, the through plug 501 may have a structure of three or more stages in the semiconductor substrate 1 as long as the upper stage portion 501a and the lower stage portion 501b are included.

The contact portion 501c is connected to the electrode pad 504. In addition, a diameter of the contact portion 501c is smaller than that of the upper stage portion 501a. This is because a contact hole for the contact portion 501c is formed by the etching using the dummy gate ring 505 as a mask.

The dummy gate ring 505 is made of the same material as the gate electrode 51 and can be simultaneously formed with the gate electrode 51. In addition, as for the dummy gate ring 505, the side surface on the inner periphery is in contact with the contact portion 501c, an outer peripheral portion of the bottom surface is in contact with the element isolation insulating film 2 and an inner peripheral portion of the bottom surface is in contact with the upper stage portion 501a.

A gate sidewall 506 formed on the side surface on the outer periphery of the dummy gate ring 505 is made of the same material as the gate sidewall 52 and can be simultaneously formed with the gate sidewall 52.

The insulating film 502 is made of insulating film such as $SiO_2$. The insulating film 502 is formed on the side face of the through plug 501 for insulating the through plug 501 from the semiconductor substrate 1.

The electrode pad 504 is made of conductive material such as Cu. A barrier metal made of Ti, etc., may be formed on a surface of the electrode pad 504.

An example of a method of fabricating the semiconductor device 500 according to the present embodiment will be described hereinafter.

FIGS. 13A to 13I are cross sectional views showing processes for fabricating the semiconductor device 500 according to the fifth embodiment.

Figure 13A:
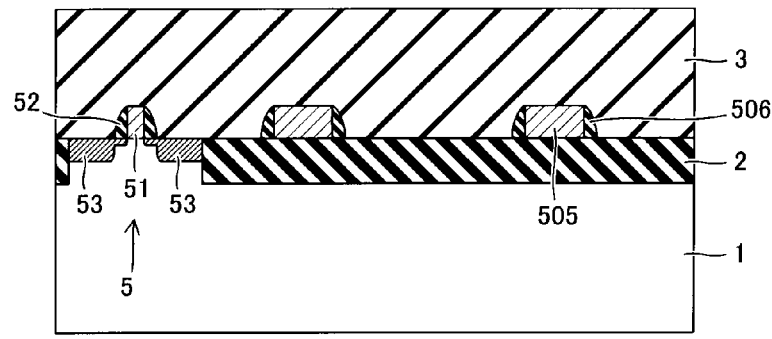
FIGS. 13A to 13I are cross sectional views showing processes for fabricating the semiconductor device according to the fifth embodiment.

Firstly, as shown in FIG. 13A, the element isolation insulating film 2, the transistor 5 and the dummy gate ring 505 are formed on the semiconductor substrate 1, and then, the interlayer insulating film 3 is formed on the semiconductor substrate 1, the element isolation insulating film 2, the transistor 5 and the dummy gate ring 505.

Here, the dummy gate ring 505 is made of the same material as the gate electrode 51 and can be simultaneously formed with the gate electrode 51. Meanwhile, the gate sidewall 506 on the side face of the dummy gate ring 505 is made of the same material as the gate sidewall 52 and can be simultaneously formed with the gate sidewall 52.

Figure 13B:
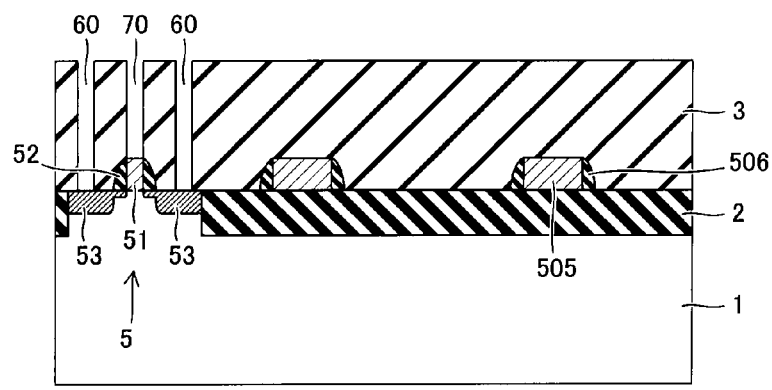

Next, as shown in FIG. 13B, contact holes 60 and 70 are formed in the interlayer insulating film 3 by a combination of photolithography method and RIE method.

Figure 13C:
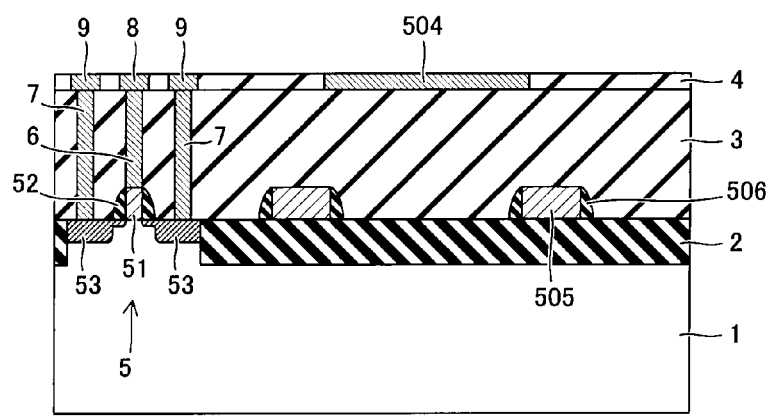

Next, as shown in FIG. 13C, the contact plugs 6 and 7 are respectively formed in the contact holes 60 and 70, and then, the interlayer insulating film 4, the wirings 8, 9 and the electrode pad 504 are formed thereon.

Figure 13D:
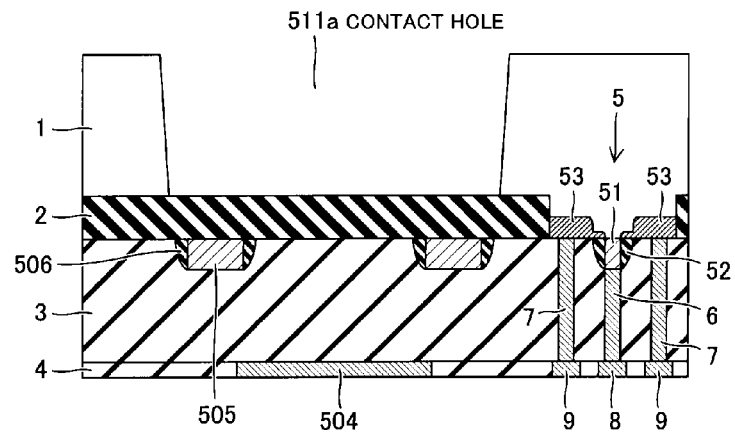

Next, as shown in FIG. 13D, a contact hole 511a is formed by etching the back surface of the semiconductor substrate 1.

In detail, after a non-illustrated supporting substrate is laminated on an upper surface of the interlayer insulating film 4 (in case that another layer is formed on the interlayer insulating film 4, it is laminated on an upper surface thereof), the semiconductor substrate 1 is turned over so that the back surface faces upwards. Next, although it is not shown in the figure, the back surface of the semiconductor substrate 1 is subjected to polishing process or wet treatment, thereby thinning the semiconductor substrate 1 to about 50 μm. Next, the contact hole 511a is formed by a combination of photolithography method and RIE method. At this time, the element isolation insulating film 2 functions as an etching stopper.

Figure 13E:
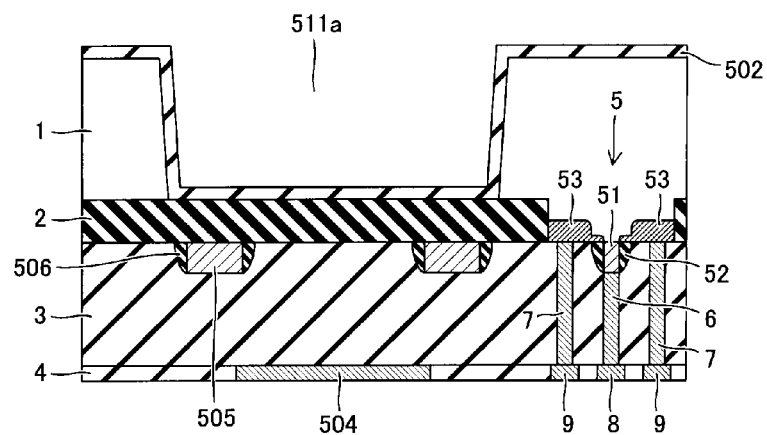

Next, as shown in FIG. 13E, the insulating film 502 is formed so as to cover an inner surface of the contact hole 511a.

Figure 13F:
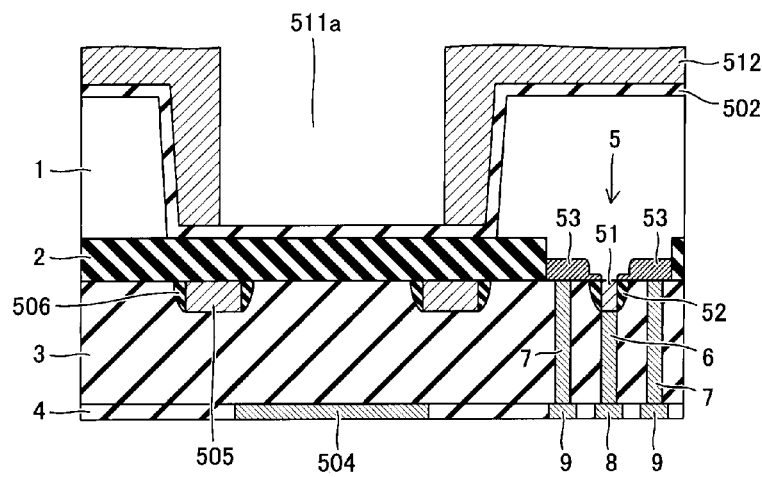

Next, as shown in FIG. 13F, an etching mask 512 of which opening pattern is a pattern of the upper stage portion 501a of the through plug 501 is formed by photolithography method.

Here, the etching mask 512 is formed so as to cover the insulating film 502 on the side face of the contact hole 511a such that the etching does not reach thereto in the next etching process. Therefore, the opening diameter of the etching mask 512 (a diameter of the upper stage portion 501a of the through plug 501) is smaller than the diameter of the contact hole 511a having the insulating film 502 formed on the inner surface thereof. In addition, the opening diameter of the etching mask 512 is smaller than the inside diameter of the dummy gate ring 505.

Note that, when the etching mask 512 is formed so as to exactly cover the insulating film 502 on the side face of the contact hole 511a, the opening diameter of the etching mask 512 is equal to a diameter of a bottom of the contact hole 511a having the insulating film 502 formed on the inner surface thereof. In this case, no step is formed between the upper stage portion 501a and the lower stage portion 501b.

Figure 13G:
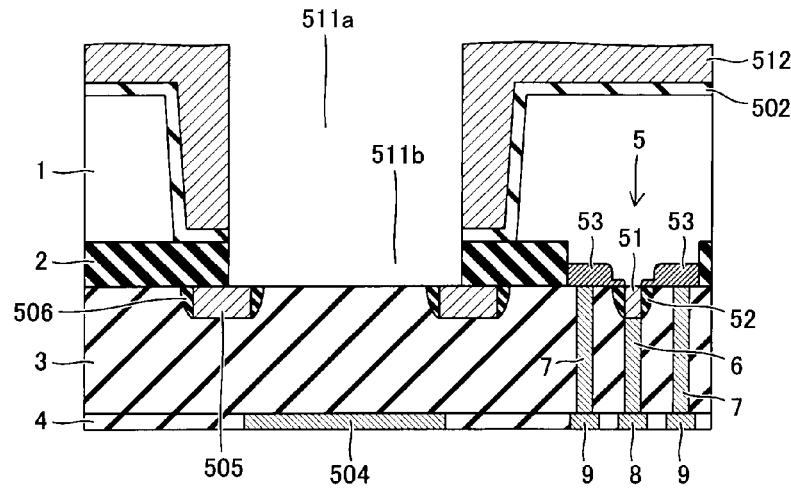

Next, as shown in FIG. 13G, the insulating film 502 on the bottom of the contact hole 511a is etched by RIE method using the etching mask 512 as mask, thereby forming a contact hole 511b.

Figure 13H:
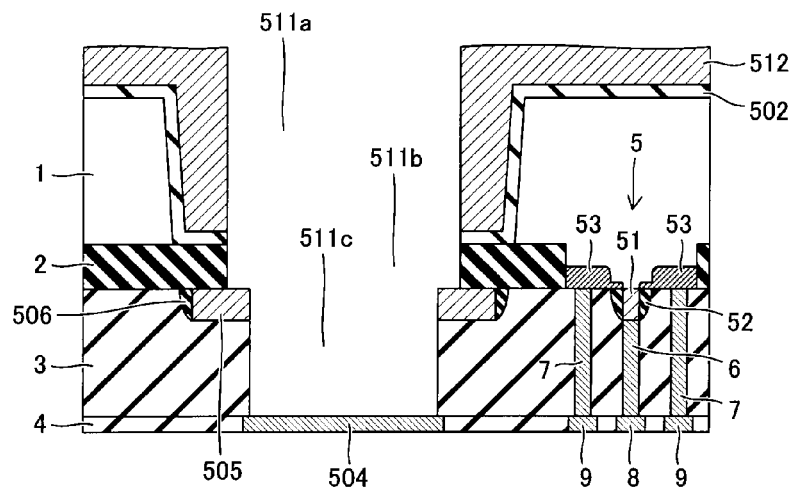

At this time, the inner peripheral portion of the bottom of the dummy gate ring 505 is exposed on a bottom of the contact hole 511b. It is possible to use the dummy gate ring 505 as an etching end point for detecting plasma emission during the etching Next, as shown in FIG. 13H, the interlayer insulating film 3 and the gate sidewalls 506 on the bottom of the contact hole 511b are etched by RIE method using the etching mask 512 and the dummy gate ring 505 as mask, thereby forming a contact hole 511c. At this time, the electrode pad 504 is exposed on the bottom of the contact hole 511c.

Figure 13I:
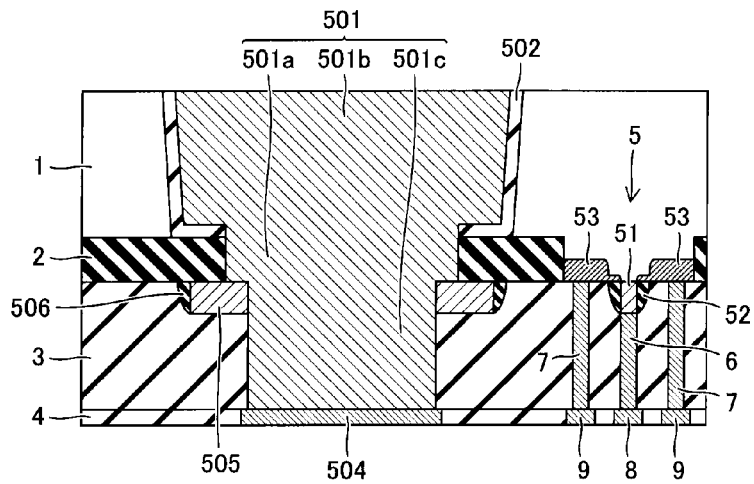

Next, as shown in FIG. 13I, after the etching mask 512 is removed, the through plug 501 is formed by filling the contact holes 511a, 511b and 511c with a conductive material.

Here, a portion of the conductive material filled in the contact hole 511c becomes the contact portion 501c, a portion filled in the contact hole 511b becomes the upper stage portion 501a, and a portion filled in the contact hole 511a becomes the lower stage portion 501b.

Effect of the Fifth Embodiment

According to the fifth embodiment, after the formation of the contact plug in the interlayer insulating film 3, there is no process of forming a contact hole for the through plug in the semiconductor substrate 1. Therefore, the problem that the bottom surface of the contact plug in the interlayer insulating film 3 is etched does not occur.

In addition, since the through plug in the semiconductor substrate 1 and the contact plug in the interlayer insulating film 3 can be integrally formed in the same process, it is possible to reduce the number of processes.

In addition, since the through plug 501 doubles as the contact plug in the interlayer insulating film 3, there is no risk of increase in the electrical resistance at a connection between the through plug in the semiconductor substrate 1 and the contact plug in the interlayer insulating film 3.

In addition, it is possible to improve process controllability of the contact hole 511c by using the dummy gate ring 505 as a etching mask at the time of forming the contact hole 511c.

In addition, it is possible to suppress the etching damage to the bottom surface of the dummy gate ring 505 by using the element isolation insulating film 2 as an etching stopper at the time of forming the contact hole 511a for the through plug 501, (see FIG. 13D). In particular, when the dummy gate ring 505 is made of Si-based crystal, it is important that the etching to the dummy gate ring 505 is prevented in the process of forming the contact hole 511a in the semiconductor substrate 1 made of Si-based crystal.

Sixth Embodiment

The sixth embodiment is different from the fifth embodiment in that a contact plug is formed on a dummy gate ring. Note that, the explanations will be omitted or simplified for the points same as the fifth embodiment.

Figure 14:
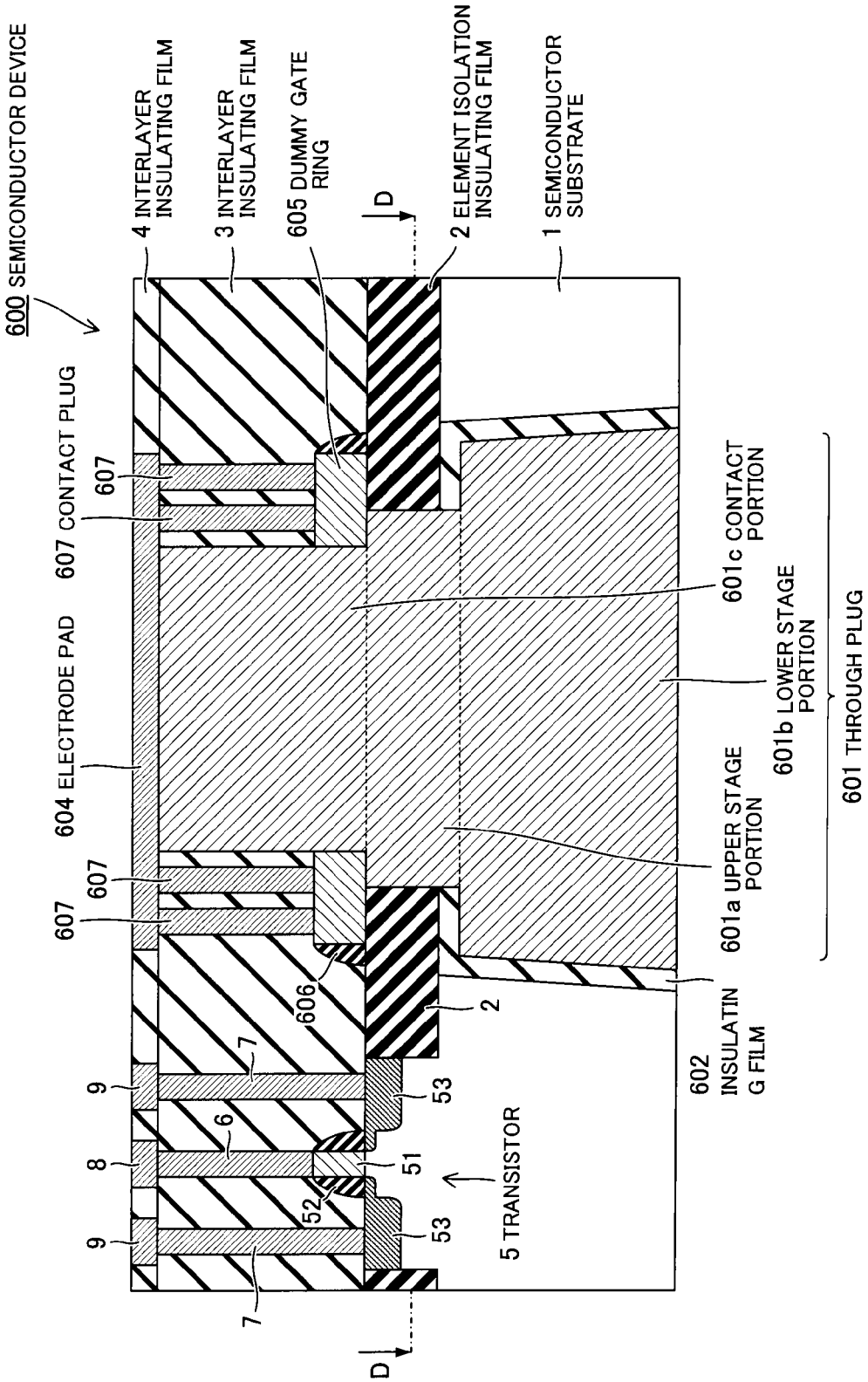
FIG. 14 is across sectional view of a semiconductor device according to a sixth embodiment.
Figure 15A:
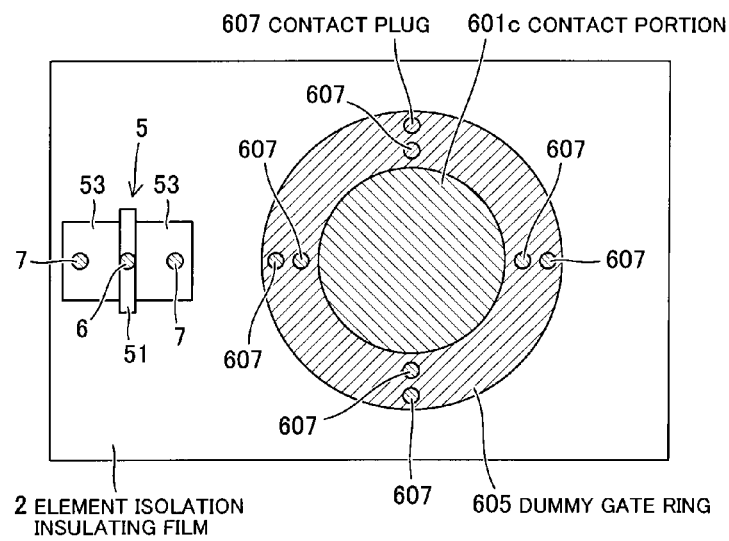
FIGS. 15A and 15B are views of the semiconductor device according to the sixth embodiment, which are respectively a plan view and a cross sectional view taken on line D-D of FIG. 14.
Figure 15B:
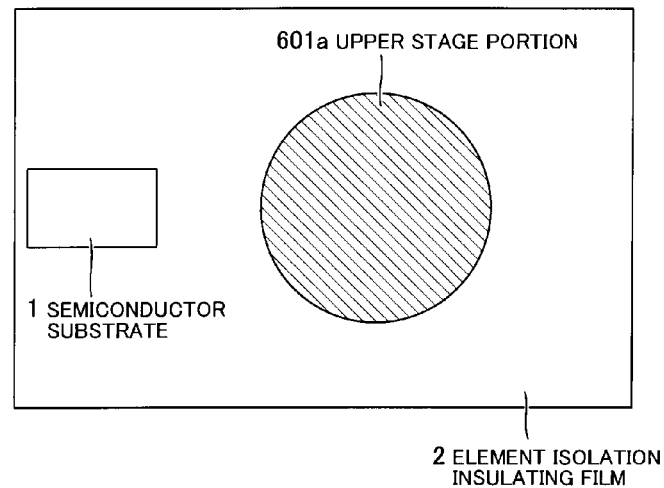

FIG. 14 is a cross sectional view of a semiconductor device 600 according to a sixth embodiment. In addition, FIG. 15A is a plan view of the semiconductor device 600 and FIG. 15B is a cross sectional view of the semiconductor device 600 taken on line D-D of FIG. 14. Note that, illustrations of below-described interlayer insulating films 3 and 4, wirings 8 and 9, an electrode pad 604 and gate sidewalls 52 and 606 are omitted in FIG. 15A.

A semiconductor device 600 has a transistor 5 formed on a semiconductor substrate 1 and electrically isolated from other elements by an element isolation insulating film 2, interlayer insulating films 3 and 4 formed on the semiconductor substrate 1, an electrode pad 604 formed in the interlayer insulating film 4, a through plug 601 penetrating the semiconductor substrate 1 as well as the interlayer insulating film 3 and connected to the electrode pad 604, a dummy gate ring 605 surrounding a periphery of the through plug 601 in the interlayer insulating film 3, and a contact plug 607 for connecting the dummy gate ring 605 and the electrode pad 604.

The through plug 601 has the same configuration as the through plug 501 in the fifth embodiment.

The dummy gate ring 605 has the same configuration as the dummy gate ring 505 in the fifth embodiment. Note that, when the dummy gate ring 605 is made of Si-based crystal, the dummy gate ring 605 is preferably a fully silicided electrode in which the entire region is metal silicide, in order to decrease electrical resistance. Co, Ni, Mn, Fe, Cu, Ta, Nb, Hf, Zr, Cr, Ru, Ir, Pt, Rh or Pd, etc., can be used as a metal of the metal silicide.

The contact plug 607 is made of conductive material which contains, e.g., W, Cu, Al or Su as a principal element. In addition, a barrier metal made of Ti, etc., may be formed on a surface of the contact plug 607. The contact plug 607 is connected to the upper surface of the dummy gate ring 605. In addition, contact plug 607 can be made of the same material and formed in the same process as the contact plugs 6 and 7. Furthermore, the arrangement and the number of the contact plug 607 are not limited to that shown in FIG. 15A.

An insulating film 602 has the same configuration as the insulating film 502 in the fifth embodiment.

An electrode pad 604 has the same configuration as the electrode pad 504 in the fifth embodiment.

An example of a method of fabricating the semiconductor device 600 according to the present embodiment will be described hereinafter.

Figure 16A:
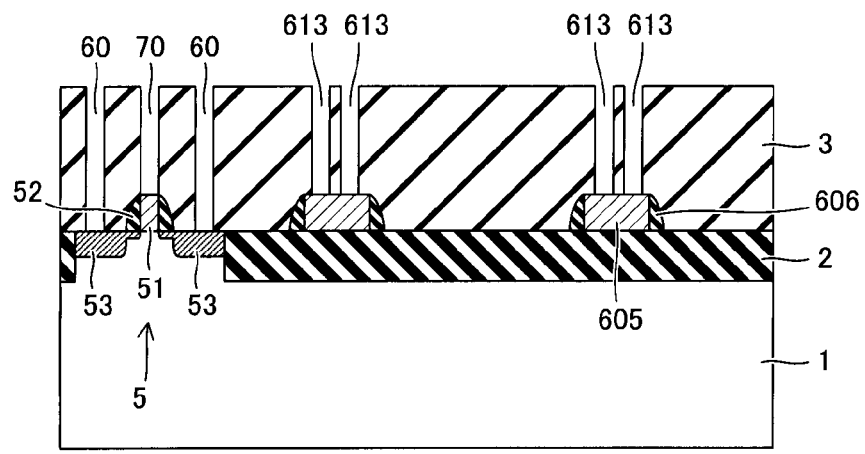
FIGS. 16A and 16B are cross sectional views showing processes for fabricating the semiconductor device according to the sixth embodiment.
Figure 16B:
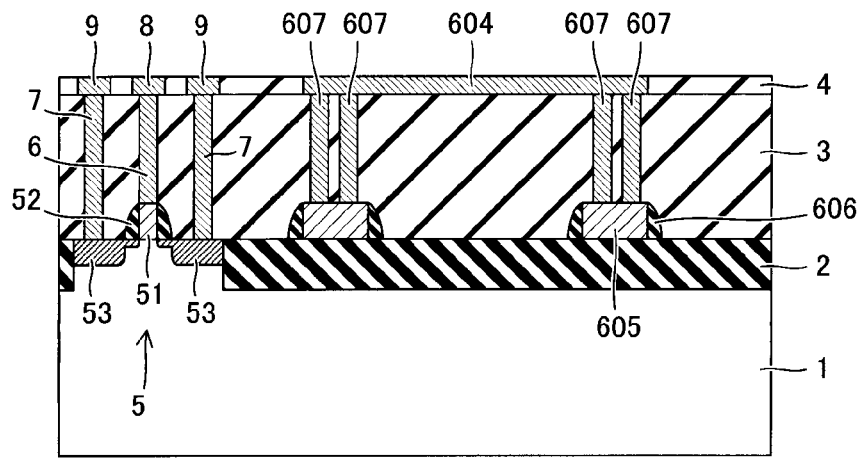

FIGS. 16A and 16B are cross sectional views showing processes for fabricating the semiconductor device 600 according to the sixth embodiment.

Firstly, the processes until the process for forming the interlayer insulating film 3 are carried out in the same way as the fifth embodiment.

Next, as shown in FIG. 16A, contact holes 60, 70 and 613 are formed in the interlayer insulating film 3 by a combination of photolithography method and RIE method.

Next, as shown in FIG. 16B, the contact plugs 6, 7 and 607 are respectively formed in the contact holes 60, 70 and 613, and then, the interlayer insulating film 4, the wirings 8, 9 and the electrode pad 604 are formed thereon.

After that, the semiconductor device 600 shown in FIG. 14 is obtained through the same processes as the fifth embodiment.

Effect of the Sixth Embodiment

According to the sixth embodiment, by forming the contact plug 607, it is possible to ensure more current paths from the back surface of the semiconductor substrate 1 to the electrode pad.

Other Embodiments

It should be noted that the present invention is not intended to be limited to the above-mentioned first to sixth embodiments, and the various kinds of changes thereof can be implemented by those skilled in the art without departing from the gist of the invention.

Furthermore, it is possible to arbitrarily combine the configurations of the above-mentioned first to sixth embodiments without departing from the gist of the invention.

What is claimed is:

1. A semiconductor device, comprising:
a semiconductor substrate;
an element isolation insulating film embedded in the vicinity of a front surface of the semiconductor substrate; a transistor formed adjacent to the element isolation insulating film;
a through plug penetrating the semiconductor substrate from a back surface to the front surface so as to penetrate through the element isolation insulating film, and having a multi-stage structure comprising an upper stage portion and a lower stage portion, the upper stage portion having a region surrounded by the element isolation insulating film in the semiconductor substrate, the lower stage portion, wherein the element isolation insulating film is formed a top surface of the lower stage portion and directly contact with the upper stage portion having a diameter larger than that of the upper stage portion; and
a contact plug formed directly on the element isolation insulating film and connected to an end portion of the through plug on the front surface side of the semiconductor substrate for connecting a conductive member formed above the front surface side of the semiconductor substrate to the through plug, wherein the upper stage portion and the lower stage portion are both formed in the semiconductor substrate.

2. The semiconductor device according to claim 1, wherein the contact plug is composed of an upper portion comprising a conductive plug and a lower portion comprising a dummy gate electrode, and has a lattice pattern or a line-and-space pattern.

3. The semiconductor device according to claim 2, wherein the through plug is in contact with the upper and lower portions of the contact plug.

4. The semiconductor device according to claim 2, wherein one line of the lattice pattern or the line-and-space pattern of the dummy gate electrode is composed of two dummy gate electrodes; a lower portion of the conductive plug is located between the two dummy gate electrodes; and a bottom surface of the conductive plug is in contact with the through plug.

5. The semiconductor device according to claim 2, further comprising: a gate electrode being made of the same material as the dummy gate electrode in a transistor region on the semiconductor substrate.

6. The semiconductor device according to claim 1, further comprising: a dummy gate ring formed so as to surround the contact plug, an outer peripheral portion of a bottom surface of the dummy gate ring being in contact with the element isolation insulating film and an inner peripheral portion of the bottom surface being in contact with the through plug, wherein the through plug is integrally formed with the contact plug; and a diameter of a region of the contact plug surrounded by the dummy gate ring is smaller than the diameter of the region of the through plug surrounded by the element isolation insulating film.

7. The semiconductor device according to claim 6, further comprising: another contact plug connected to an upper surface of the dummy gate ring.

8. The semiconductor device according to claim 7, wherein the dummy gate ring is a fully silicided electrode.

9. The semiconductor device according to claim 6, further comprising: a gate electrode being made of the same material as the dummy gate ring in a transistor region on the semiconductor substrate.

* * * * *